US 11,429,773 B1

United States Patent
Vlasov

(10) Patent No.: US 11,429,773 B1
(45) Date of Patent: Aug. 30, 2022

(54) METHODS, SYSTEMS, AND COMPUTER PROGRAM PRODUCT FOR IMPLEMENTING AN ELECTRONIC DESIGN USING CONNECT MODULES WITH DYNAMIC AND INTERACTIVE CONTROL

(71) Applicant: Cadence Design Systems, Inc., San Jose, CA (US)

(72) Inventor: Evgeny Vlasov, Munich (DE)

(73) Assignee: Cadence Design Systems, Inc.

( * ) Notice: Subject to any disclaimer, the term of this patent is extended or adjusted under 35 U.S.C. 154(b) by 0 days.

(21) Appl. No.: 17/138,853

(22) Filed: Dec. 30, 2020

(51) Int. Cl.
*G06F 30/38* (2020.01)
*G06F 30/333* (2020.01)
*G06F 30/33* (2020.01)
*G06F 30/398* (2020.01)

(52) U.S. Cl.
CPC ............ *G06F 30/38* (2020.01); *G06F 30/333* (2020.01); *G06F 30/33* (2020.01); *G06F 30/398* (2020.01)

(58) Field of Classification Search
CPC ........ G06F 30/38; G06F 30/333; G06F 30/33; G06F 30/398
USPC ........ 716/100, 106, 111, 136; 703/14, 15, 16
See application file for complete search history.

(56) References Cited

U.S. PATENT DOCUMENTS

| | | | |
|---|---|---|---|
| 7,240,303 B1 * | 7/2007 | Schubert | G01R 31/31705 716/106 |
| 7,251,795 B2 | 7/2007 | Biswas et al. | |
| 7,672,827 B1 | 3/2010 | Schapira et al. | |
| 8,417,505 B1 * | 4/2013 | Guo | G06F 30/367 703/14 |
| 8,531,940 B2 * | 9/2013 | Lerzer | G06F 13/4022 370/216 |
| 8,571,837 B1 * | 10/2013 | Hou | G06F 30/367 703/2 |
| 8,949,100 B1 * | 2/2015 | Cranston | G06F 30/367 703/14 |
| 9,041,967 B1 * | 5/2015 | Ding | G06F 3/1236 358/1.15 |
| 10,380,294 B1 * | 8/2019 | Spratt | G06F 30/33 |
| 10,769,336 B1 * | 9/2020 | Zhang | G06F 30/36 |
| 2002/0049576 A1 | 4/2002 | Meyer | |
| 2003/0069724 A1 * | 4/2003 | Schubert | G01R 31/318357 703/16 |
| 2011/0296364 A1 * | 12/2011 | Chen | G06F 30/39 716/122 |

(Continued)

OTHER PUBLICATIONS

Chen, S., "Mixed-Signal Design for Analog-Centric & Digital-Centric Verification," Graser User Conference, dated Aug. 13, 2013.

(Continued)

*Primary Examiner* — Phallaka Kik

(74) *Attorney, Agent, or Firm* — Vista IP Law Group, LLP

(57) ABSTRACT

Disclosed are methods, systems, and articles of manufacture for implementing an electronic design using connect modules with dynamic and interactive control. An electronic design comprising a signal propagating across a boundary between a digital domain and an analog domain may be identified, and an analysis may be initiated for the electronic design. A connect module framework may provision for one or more dynamically placed objects in the electronic design. An internal characteristic of the one or more dynamically placed objects may be accessed with the connect module framework.

20 Claims, 12 Drawing Sheets

(56) References Cited

U.S. PATENT DOCUMENTS

2018/0165053 A1* 6/2018 Kuo .......................... G06F 1/16
2019/0114268 A1* 4/2019 Zhu ...................... G06F 13/102

OTHER PUBLICATIONS

Frey, P., et al., "Verilog-AMS: Mixed-Signal Simulation and Cross Domain Connect Modules," Cadence Design Systems, Inc., dated 2000.
Zinke, O., "Bi-Directional Mixed Signal Connection Modules for Automatic Insertion," IEEE, dated 2002.
"App Note Spotlight—Introduction to Connect Modules," Cadence Design Systems, Inc., dated Jan. 2018.
Miller, G., "Mixed Signal Behavior Models," Verilog-A and Verilog-AMS Reference Manual, dated May 2008.

* cited by examiner

METHODS, SYSTEMS, AND COMPUTER PROGRAM PRODUCT FOR IMPLEMENTING AN ELECTRONIC DESIGN USING CONNECT MODULES WITH DYNAMIC AND INTERACTIVE CONTROL

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high-level behavior description of the IC device and translates this high-level design description into netlists at various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools.

Modern electronic designs proceed through a series of design implementation tasks prior to manufacturing. These design implementation tasks involve multiple rounds of analyses, verification, error fixes, optimizations, ECOs (Engineering Change Orders), etc. at various stages of the electronic design implementation in several different abstractions (e.g., schematic, layout, etc.) Analyzing an electronic circuit design include various simulations, statistical analyses (e.g., regression analysis, Monte-Carlo analysis, etc.), various checks and verifications (e.g., between a design specification and circuit behavior), etc.

Modern mixed-signal electronic designs have both multiple disciplines (e.g., logic, bit, real, user-defined net types, etc.) As a result, some nets may transition from, for example, logic to electrical (or user-defined), some other nets may transition from electrical to logic (or user-defined), and some other nets may transition from a user-defined net type to a logic or an electrical discipline. During design verification, modern verification tool places connect modules when a signal transitions between these two disciplines. For example, a verification tool may, at runtime, insert a logic-to-electrical (or L2E) connect module at the boundary between the logic discipline and the electrical discipline and place an electrical-to-logic (E2L) connect module at the boundary between the electrical discipline and the logic discipline. Moreover, some nets may not have an explicit discipline and thus require techniques such as discipline resolution techniques and/or discipline coercion techniques during elaboration to determine the exact discipline of these nets.

Nonetheless, these conventional approaches with connect modules present shortcomings and challenges. For example, these connect modules are determined and placed at runtime during a verification or simulation so the identifications and placement of these connect modules are unknown to a designer. Designers are unable to find misbehaving connect modules without knowing what connect modules are and where connect modules are placed in an electronic design, As a result, it is extremely difficult, if not entirely impossible, to exercise any control over any of these connect modules. Designers are thus forced to first run the simulation or verification to obtain the information (e.g., identifications, locations, etc.) of connect modules inserted into an electronic design.

Furthermore, although these approaches provide the information of connect modules inserted into an electronic design, they do so at the expense of a full simulation run. Moreover, although these approaches provide the information of connect modules inserted into an electronic design, designers still do not have any control over any of the connect modules during runtime. That is, any modifications (e.g., reconfiguration of any connect modules, assertion of a different value, etc.) can only be done ahead of time, and the electronic design needs to be re-elaborated due to these modifications. Once the electronic design is re-elaborated, another simulation may be executed with these modifications.

Another impractical approach for addressing the aforementioned challenges is to ask a designer to parse a textual, ASCII, or binary log file (e.g., an IEinfo.log) that is dynamically generated during the creation and placement of connect modules during runtime. This approach is impractical at best due to the sheer amount of data in the range of several hundreds of megabytes of such a log file and the unstructured nature of the log file that prohibits any efficient queries or searches.

Therefore, there is a need for implementing an electronic design using connect modules with dynamic and/or interactive control over any of the connect modules.

SUMMARY

Disclosed are method(s), system(s), and article(s) of manufacture for implementing an electronic design using connect modules with dynamic and interactive control in one or more embodiments. Some embodiments are directed at a method for implementing an electronic design using connect modules with dynamic and interactive control. These embodiments identify an electronic design comprising a signal propagating across a boundary between a digital domain and an analog domain, and an analysis may be initiated for the electronic design. A connect module framework may provision for one or more dynamically placed objects in the electronic design. An internal characteristic of the one or more dynamically placed objects may be accessed with the connect module framework.

In some embodiments, to access the internal characteristic of the one or more dynamically placed objects, a parameter or a variable inside a connect module may be modified into a modified parameter or a modified variable with the connect module framework for the analysis to continue with the modified parameter or the modified variable, without re-elaborating the electronic design or any portion thereof and without interrupting the analysis.

In some embodiments, to provision for the one or more dynamically placed objects, a set of functions that provide read or write access to the internal characteristic of a dynamically placed object of the one or more dynamically placed objects in the electronic design may be determined.

In some of these embodiments, to provision for the one or more dynamically placed objects, the set of functions may be registered, and a bidirectional flow between the electronic design and the internal characteristic of the dynamically placed object may be provisioned by using at least at least a first portion of the set of functions.

In some embodiments, to provision for the one or more dynamically placed objects, dynamic debugging or control may be provisioned for the dynamically placed object using at least a second portion of the set of functions; and interactive manipulation of the dynamically placed object may be provisioned with at least a set of interpretative functions, wherein the set of interpretative functions comprises a Tcl function.

In addition or in the alternative, to provision for the one or more dynamically placed objects, a dynamic flow for the electronic design may be provisioned using at least an extension file.

In some embodiments, the set of functions that provides the access to the internal characteristic of the dynamically placed object may include at least one of identifying, at the connect module framework, a set of connect modules that matches a specific setting; or adjusting an internal parameter or a value thereof of a connect module during the analysis of the electronic design.

In some embodiments, the set of functions that provides the access to the internal characteristic of the dynamically placed object may include at least one of dynamically switching on or off the dynamically placed object during the analysis of the electronic design; or applying an assertion to the dynamically placed object during the analysis of the electronic design.

In some embodiments, the set of functions that provides the access to the internal characteristic of the dynamically placed object may include at least one of identifying one or more nets or one or more net segments along which a requisite number of dynamically placed objects are placed; or identifying one or more dynamically placed objects distributed at one or more specific hierarchical levels.

In some embodiments, the set of functions that provides the access to the internal characteristic of the dynamically placed object may include at least one of identifying one or more dynamically placed objects placed on one or more non-uniquely named nets or net segments; determining an updated value from the dynamically placed object during the analysis of the electronic design; or storing the updated value from the dynamically placed object in a data structure.

Some embodiments are directed at a hardware system that may be invoked to perform any of the methods, processes, or sub-processes disclosed herein. The hardware system may include at least one microprocessor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

Additional and other objects, features, and advantages of the disclosure are described in the Detail Description, figures, and claims.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present disclosures briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1A:
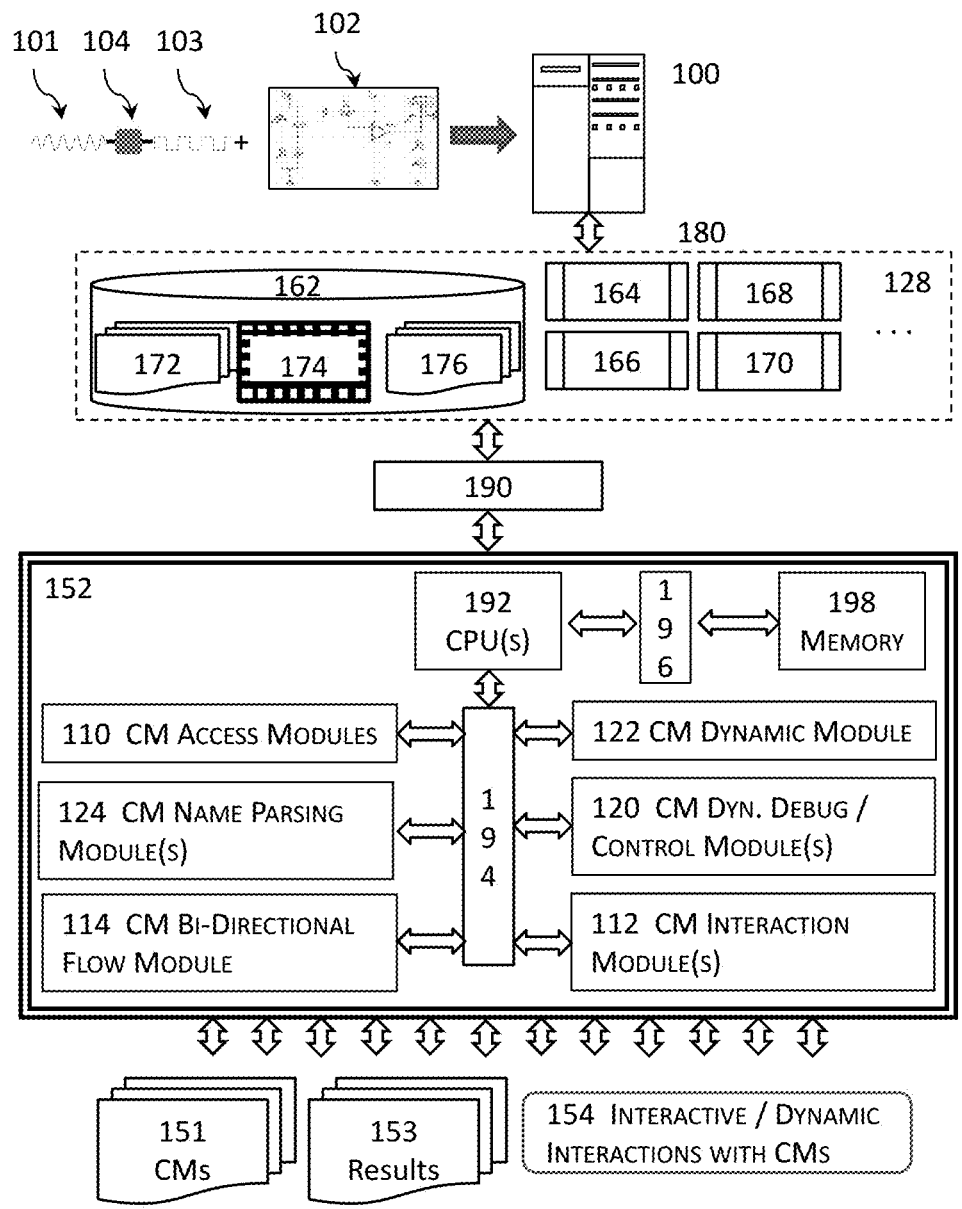
FIG. 1A illustrates a high-level block diagram of a simplified system for implementing an electronic design using connect modules with dynamic and interactive control in one or more embodiments.

Various embodiments will now be described in detail with reference to the drawings, which are provided as illustrative examples of the invention so as to enable those skilled in the art to practice the invention. Notably, the figures and the examples below are not meant to limit the scope of the present disclosure. Where certain elements of the present disclosure may be partially or fully implemented using known components (or methods or processes), only those portions of such known components (or methods or processes) that are necessary for an understanding of the present disclosure will be described, and the detailed descriptions of other portions of such known components (or methods or processes) will be omitted so as not to obscure the invention. Further, various embodiments encompass present and future known equivalents to the components referred to herein by way of illustration.

Further, various embodiments encompass present and future known equivalents to the components referred to herein by way of illustration. It shall be noted that various features and techniques are described hereinafter in terms of embodiments and/or examples. Unless otherwise explicitly described as mutually exclusive, any embodiment, example, feature, and/or characteristic described herein may be readily combined in any suitable manner with any other embodiment, example, feature, and/or characteristic, without departing from the scope or spirit of the present disclosures. All such modifications are intended to be within the scope of claims associated with this disclosure.

In the following description, certain specific details are set forth in order to provide a thorough understanding of various disclosed embodiments. However, one skilled in the relevant art will recognize that embodiments may be practiced without one or more of these specific details, or with other methods, components, etc. In other instances, well-known structures associated with computing systems have not been shown or described in detail to avoid unnecessarily obscuring descriptions of the embodiments.

In addition, unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It shall be noted that although some examples or embodiments are described herein with reference to connect module, the same techniques may also be provided to other types of objects in an electronic design. Thus, the reference to connect module or connect modules is merely described herein as non-limiting examples.

FIG. 1A illustrates a high-level block diagram of a simplified system for implementing an electronic design using connect modules with dynamic and interactive control in one or more embodiments. More specifically, the computing system 100 in FIG. 1A may comprise one or more physical computing systems or virtual machines 100, such as a general-purpose computer described in the System Architecture Overview section to implement one or more special proposes. The illustrative system in FIG. 1A may include an Internet-based computing platform providing a shared pool of configurable computer processing resources (e.g., computer networks, servers, storage, applications, services, a cloud environment, etc.) and data to other computers and devices in a ubiquitous, on-demand basis via the Internet. For example, one or more computing resources and/or modules illustrated in FIG. 1A may be located in a cloud computing platform where computing resources (e.g., storage resources, compute resources, etc.) are provided on an on-demand basis without direct active management by users in some embodiments.

In this system illustrated in FIG. 1A, one or more computing systems 100 may invoke and execute various modules to a mixed-signal electronic design 102 having both the analog discipline 101 and the digital discipline 103 where at least one signal propagates across the boundaries between the analog discipline 101 and the digital discipline 103 and thus invokes an insertion of a connect module 104. The one or more computing systems 100 may invoke and execute a plurality of modules 152 of a connect module framework, which plurality of modules are specifically programmed and stored at least partially in memory of and functions in conjunction with at least one microprocessor (e.g., a central computing unit, a virtualized microprocessor, etc. 192) or processor core of the one or more computing systems 100, to perform various functions to determine, for example, a list of connect modules 151, intermediate and/or final analysis results 153, etc. in response to interactive and/or dynamic interactions with one or more connect modules 154 in the mixed-signal electronic design 102.

The mixed-signal electronic design 102 may be provided to one or more modules in the plurality of modules 152 which may further execute one or more tasks for implementing an electronic design using connect modules with dynamic and interactive control. For example, a connect module (CM) debug and/or control module or engine 120 may, either on its own or in conjunction with one or more other modules or engines, perform debugging and/or various controls to one or more connect modules in the mixed-signal electronic design 102.

Some embodiments described herein may provide various levels of access to a connect module in the mixed-signal electronic design 102. For example, a connect module bi-directional data flow module or engine 114 may provide bidirectional data flows between one or more connect modules and the electronic design (or the testbench therefor).

Moreover, the one or more computing systems 100 may execute a connect module access module (110) provides access to one or more internal characteristics (e.g., one or more parameters, one or more settings, one or more variables, etc.) of a connect module. The one or more computing systems 100 may also execute one or more connect module name parsing modules 124 that performs respective functions based on a name or identifier of a connect module.

The one or more computing systems 100 may execute a connect module dynamic module 122 that provides various functions dynamically (e.g., during a simulation of a testbench for the mixed-signal electronic design 102). The set of modules 152 may also include one or more connect module interaction modules 112 that enables a user to interact with any specific connect module in the mixed-signal electronic design 102 before, during, or after an analysis of the mixed-signal design 102. More details about the modules in the plurality of modules 152 will be described below.

The plurality of modules 152 may further include one or more electronic design automation tools (not shown) such as a layout editor for editing a layout, a floor planning tool for generating floorplan(s) for an electronic design, a placement tool for placing circuit component designs into a layout, a routing tool for interconnecting circuit component designs placed by the placement tool or floorplanning tool, a physical verification tool (e.g., a DRC or design rule check tool, an LVS or layout versus schematic tool, an XOR or exclusive tool, an antenna check tool, an ERC or electrical rule check tool, etc.) for ensuring correct electrical and logical functionality and manufacturability, a logic synthesis tool, a clock inserting tool for clock wiring, a post-layout optimization tool for ensuring, for example, performance, noise, signal integrity, and/or yield meets the requirements, a DFM (design for manufacturability) tool to ensure manufacturability of an electronic design by, for example, inserting redundant and/or dummy via(s) and/or metal, diffusion, and/or polysilicon layer(s), an error checking tool for ensuring the mapping to logic is performed correctly, a tapeout and mask generation tool for transforming design data into mask data for photomasks, any other tools pertaining to the physical abstraction of an electronic design, or any combinations thereof. In some embodiments, these one or more electronic design automation tools may be included as one or more corresponding general computing resources in 128.

The set of modules 152 may include or at least function in conjunction with a microprocessor 192 (e.g., a central processing unit or CPU) via a system bus 194 to access or invoke various modules in 152 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a data bus 196 to read and/or write data during the microprocessor's execution of processes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise, for example, a floorplanner, a global routing engine, and/or a detail routing engine 164, a layout editor 166, a design rule checker 168, a verification engine 170, etc.

These various resources 128 may further include, for example, one or more other EDA (electronic design automation) modules such as a schematic tool, a placement tool, a routing tool, verification tools, post-route or post-layout optimization tools, various photolithography tools (e.g., optical proximity correction or OPC tools, phase shift mask or PSM tools, resolution enhancement technology or RET tools, etc.), etc. to prepare the electronic design.

For example, these various resources 128 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

Strictly as an example, the one or more signoff modules may individually or in conjunction with one or more other modules (e.g., one or more modules in the plurality of modules 152, etc.), power closure related tasks, and/or power analyses to ensure an electronic design meets power, performance, or any other requirements before tapeout. The one or more signoff modules may include one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), electrical rule checks (ERC), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

Once sign-off and/or design closure is achieved, the electronic design is finalized for tapeout; and the electronic design is transmitted to mask fabrication equipment for mask preparation and mask writing to produce photomasks that are then used in the actual manufacturing of the electronic circuits represented by the electronic design.

The one or more computing systems 100 may further write to and read from a local or remote (e.g., networked storage device(s), virtualized storage resource(s), etc.) non-transitory computer accessible storage 162 that stores thereupon data or information such as, but not limited to, one or more databases (174) such as schematic design database(s) or physical design database(s), electronic circuit design specification database(s), techfiles (or technology files) for multiple manufacturing processes for fabricating an underlying electronic design, various statistics, various data, rule decks, various design rules, constraints, etc. (172), or other pertinent information or data (176) that may be used to facilitate the performance of various functions described herein.

In some embodiments, the computing system 100 may include the various resources 128 such that these various resources may be invoked from within the computing system via a network or a computer bus 190 (e.g., an internet session, an intranet session, a data bus 196 interfacing a physical or virtual microprocessor 192 and the non-transitory computer accessible storage medium 198 (e.g., memory) or a system bus 194 between a microprocessor 192 and one or more engines or modules in the various resources 128). In some other embodiments, some or all of these various resources may be located remotely from the computing system 100 such that the computing system may access the some or all of these resources via a computer bus 190 and one or more network components.

In some embodiments, the computing system 100 may include the various resources 128 such that these various resources may be invoked from within the computing system via a system bus 194 (e.g., a data bus interfacing a microprocessor 192 and the non-transitory computer accessible storage medium 198 or a computer bus 190 between a microprocessor 192 and one or more engines in the various resources 128). In some other embodiments, some or all of these various resources may be located remotely from the computing system 100 such that a computing system 100 may access the some or all of these resources via a computer bus and/or one or more network components.

Figure 1B:
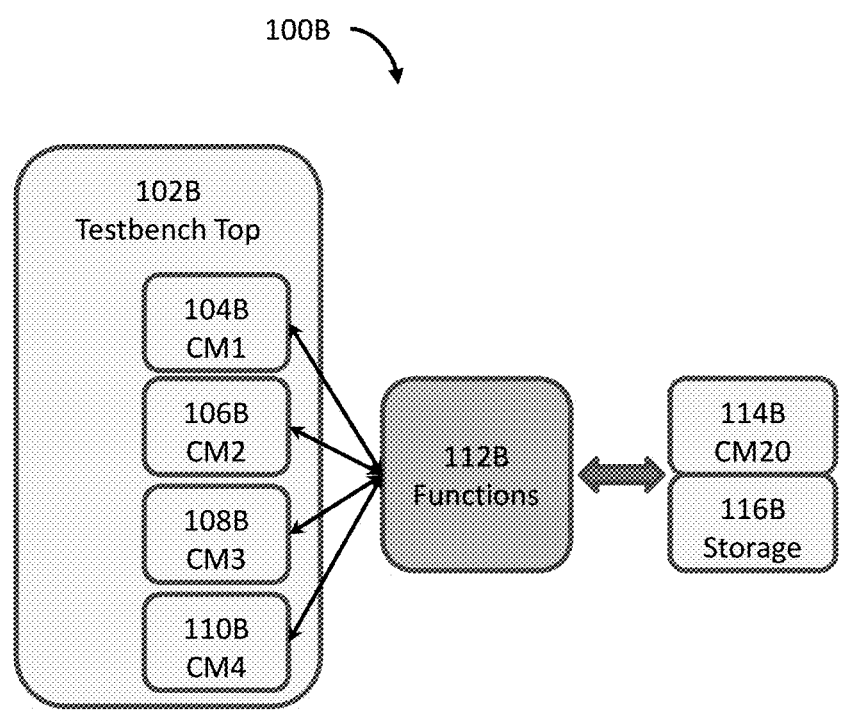
FIG. 1B illustrates a simplified architecture for implementing an electronic design using connect modules with dynamic and interactive control with a connect module framework in one or more embodiments.

FIG. 1B illustrates a simplified example architecture for implementing an electronic design using connect modules with dynamic and interactive control with a connect module framework in one or more embodiments. More specifically, in this simplified example architecture illustrated in FIG. 1B, a set of functions (e.g., VPI functions, Tcl functions, etc.) 112B that provides various functionalities (e.g., accesses, modifications, controls, etc. to values inside the simulator of a testbench top 102B) and uses this set of functions to, for example, read data, write data, control behaviors or states of one or more connect modules, etc. with regard to one or more connect modules (e.g., 104B, 106B, 108B, 112B)

In some embodiments, the connect module framework 114B (which may also be referred to as "CM20") in the simplified example architecture 100B may use an intermediate storage 116B to temporarily or persistently store data (e.g., values to change a setting of a connect module, etc.) This intermediate storage 116B may be locally coupled to the connect module framework 114B in some embodiments (e.g., located on the same computing node) or remotely coupled to the connect module framework (e.g., located in a storage network external to the computing node on which the connect module framework 114B is located). In some embodiments, the connect module framework 114B may include the set of functions 112B and/or the intermediate storage 116B.

In some embodiments, the connect module framework 114B comprises a top module (CM20.sv described herein) that includes one or more user-defined software routines, functions, etc. that may be performed over connect modules or data thereof. The connect module framework may further include a package file (e.g., CM20_pkg.sv described herein for SystemVerilog) with all access functions, a set of VPI functions (e.g., CM20.c described herein), a universal connect module extension or header file (e.g., CM20.h described herein for Verilog-AMS, SystemVerilog-AMS), an arguments file (e.g., xrunArgs_CM20) for xrun to augment the existing xrunArgs which is a simulator run argument file (e.g., a logic simulation engine), and/or a library of one or more connect modules (e.g., connect_lib described herein).

An example test case is illustrated in the code/pseudocode below:

```
always @(Provoke_EEnet_IE.DUT.T_over_sample) begin
  if($realtime !=0) begin
    value2 = Provoke_EEnet_IE.DUT.T_over_sample/
    oversampling;
    $display("\f", value2);
    display_title("Adjust sampling time connect modules");
    foreach( all_cm[i] ) begin
      name = all_cm[i];
      cm_update_real_sv(name, "m_Ts", value2);
    end
  end
end
always #20us begin
  @(posedge Provoke_EEnet_IE.DUT.pll)
  oversampling = oversampling +1;
  value2 = Provoke_EEnet_IE.DUT.T_over_sample/oversampling);
  $display("\f", oversampling);
  display_title("Adjust sampling time connect modules");
  foreach( all_cm[i]) begin
    name = all_cm[i];
    cm_update_real_sv(name, "m_Ts", value2);
  end
end
```

Figure 2A:
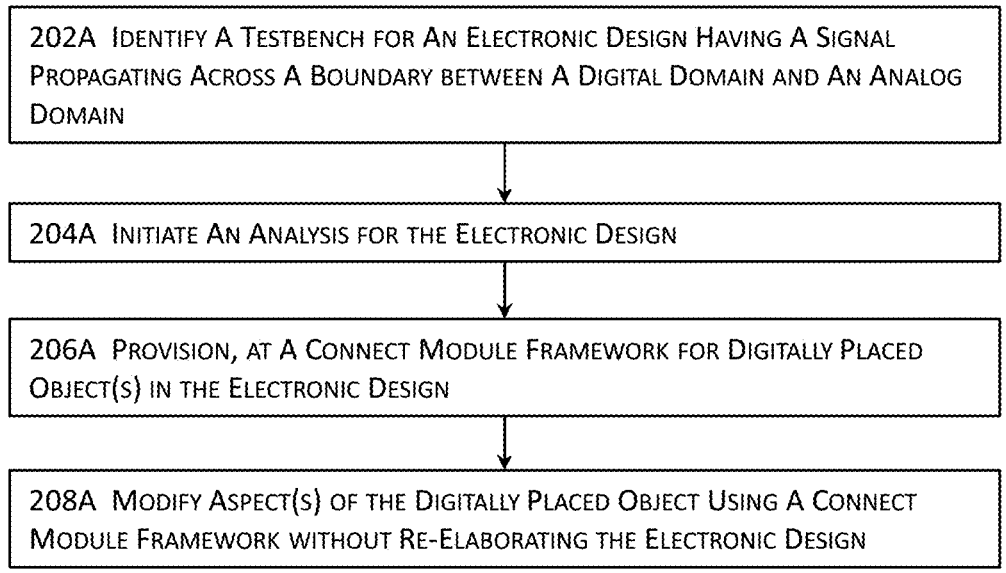
FIG. 2A illustrates a high-level flow diagram for implementing an electronic design using connect modules with dynamic and interactive control in one or more embodiments.

FIG. 2A illustrates a high-level flow diagram for implementing an electronic design using connect modules with dynamic and interactive control in one or more embodiments. In these one or more embodiments, an electronic design or a testbench therefor may be identified at 202A, where the electronic design comprises one or more digital domains and one or more analog domains with at least one signal propagating across a boundary between a digital domain and an analog domain in the electronic design.

Due to the propagation of at least one signal between a digital domain and an analog domain, an analysis (e.g., simulation) of the electronic design or the testbench has to happen in both analog and digital contexts. Analog signals are continuous, which means analog signals cannot be described by simply using 0 or 1. Analog signals could be anywhere between two values, so analog signals may be described as "continuous." Moreover, analog signals in an electronic design may have a completely different range than the values used to represent the digital signals. Digital signals functionally may have two discrete states in most circuits—on or off—so digital signals may be referred to as "discrete." Digital states may also include X, Z, strengths, and digital signals may have other states. For example, X denotes that a signal is zero (0) or one (1) but is unknown; and Z denotes that a signal has no driver and is also known as a high-impedance state.

The mixed-signal analysis for the electronic design or the testbench thus has to traverse these incompatible domains so as to require some method of translating analog signals to digital signals and vice versa. In various embodiments described herein, a connect module is used to translate between a digital (discrete) and an analog (continuous) domain or between a pair of incompatible discrete disciplines (e.g., logic and real datatypes).

In some embodiments, a connect module is a Verilog-AMS or SV-AMS (SystemVerilog Analog Mixed-Signal) module that is designed to translate a signal between discrete and continuous domains. A connect module may be varyingly complex based at least in part on the need yet may have the capabilities to accommodate any required adjustments, like input threshold delays, output impedance, and/or power supply sensitivity, etc.

Unfortunately, although designers may just manually place a connect module anywhere in an electronic design, such manual is impractical at best due to various reasons such as a often larger number of connect modules to insert. A connect module may be usually inserted after a discipline resolution (DR) process which may be invoked at an earlier stage of an analysis in some embodiments. As a result, designers have no knowledge of any connect modules placed in an electronic design before starting the analysis. Instead, designers start the first run of the analysis, wait for the analysis to complete, review the analysis result to identify any errors or misbehaviors, modify the electronic design in an attempt to resolve the errors or misbehaviors, re-elaborate the modified electronic design, and perform any another analysis to see if the misbehaviors or errors are resolved. The aforementioned iterative loop of computing intensive tasks is often iteratively performed multiple times before all or most of the errors or misbehaviors are resolved and hence unnecessarily wasting computing resources.

Moreover, the placement of a connect module is typically recorded in an unstructured, textual, ASCII, or binary log file that usually has a size in the range of several hundreds of Megabytes. Parsing through such an unstructured log to identify a specific connect module is practically impossible, let alone obtaining or deriving any other useful information (e.g., identification of misbehaviors, etc.) therefrom. The connect module (CM) framework described herein addresses these very problems and challenges and provides a suite of functions and capabilities to enable designers to interact with, modify, manipulate, etc. connect modules in a mixed-signal electronic design in an interactive and/or dynamic manner (e.g., during, and/or after the execution of an analysis). More details and benefits provided by the connect framework will become apparent with the description of various figures herein.

With the electronic design or the testbench therefor identified at 202A, an analysis may be initiated at 204A for the electronic design or the testbench therefor. For example, a Verilog simulation, a SystemVerilog simulation, a verification, a debugging task, etc. may be performed at 204A for the appropriate abstraction of the electronic design or the testbench therefor. In some embodiments, required or desired connect modules may be automatically and/or programmatically placed in the electronic design by, for example, performing a discipline resolution or discipline collision on the electronic design to accommodate the scenario that at least one signal propagates between a discrete domain and a continuous domain. These connect modules are placed in the electronic design by an electronic design automation tool, and thus users will have no knowledge (e.g., the number of connect modules placed, where a connect module is placed, any details about a connect module, etc.) about these connect modules, despite that information about connect modules in the electronic design may be pushed to an unstructured textual, or ASCII log.

During the performance of the analysis or after the completion of the analysis, the analysis may reveal any errors and/or misbehaviors of a connect module or a portion of the electronic design including the connect module. Nonetheless, users who have no knowledge of any information about connect modules in the electronic design may have great difficulties in fixing these errors and/or misbehaviors. Although information about connect modules placed in the electronic design is unknown to users, a connect module framework (e.g., 114B in FIG. 1B) may identify and provision for one or more dynamically placed objects in the electronic design at 206A. in some embodiments, the one or more dynamically placed objects comprise a connect module.

The connect module framework may provision several different functionalities for connect modules. For example, one or more modules described herein may perform the analysis for the electronic design having connect modules placed therein with a set of stimuli (e.g., input signal(s), etc.) The connect module framework may identify or determine, for example, all connected modules placed in the electronic design with the techniques described herein. The connect module framework may determine the name or identifier (e.g., a full hierarchical name) of any connect module placed in the electronic design.

In some embodiments, the connect module framework may provision a plurality of functions that have read and/or write access to one or more internal characteristics (e.g., one or more parameters, one or more settings, one or more variables, one or more values thereof, etc.) of any connect module in the electronic design. Some or all of these functions may be performed interactively and/or dynamically (e.g., before, during, or after the analysis task). In some embodiments, the connect module framework may provision debugging functions for debugging the electronic design. More details about the functionalities and capabilities of a connect module framework will be described below with reference to the remaining figures.

One or more aspects of the one or more dynamically placed objects provisioned for at 206A may be accessed (e.g., read, write, add, delete, etc.) at 208A using the connect module framework in some embodiments. For example, the analysis may reveal an error pertaining to a dynamically placed object in the electronic design. The connect module framework may identify this specific dynamically placed object and provides one or more functions for a user to access one or more internal characteristics of the dynamically placed object. The user may use these one or more functions to access and modify one or more parameters, one or more settings, one or more variables, and/or one or more values thereof, etc. of the dynamically placed object, change the state of the dynamically placed object (e.g., turn on/off the connect module), etc., all without re-elaborating the electronic design. In some embodiments where such modifications are performed dynamically during the execution and prior to the completion of the analysis, the analysis may continue with the modified value(s) without interrupting the analysis.

In some embodiments, the modification may be done dynamically (e.g., while the analysis is running) and/or interactively. For example, a user may use one or more of the functions provided by the connect module framework to control one or more dynamically placed objects (e.g., connect modules) in the electronic design during runtime, access one or more dynamically placed objects (e.g., connect modules) from the testbench and/or a debug tool, etc., and/or extend one or more dynamically placed objects (e.g., connect modules).

Figure 2B:
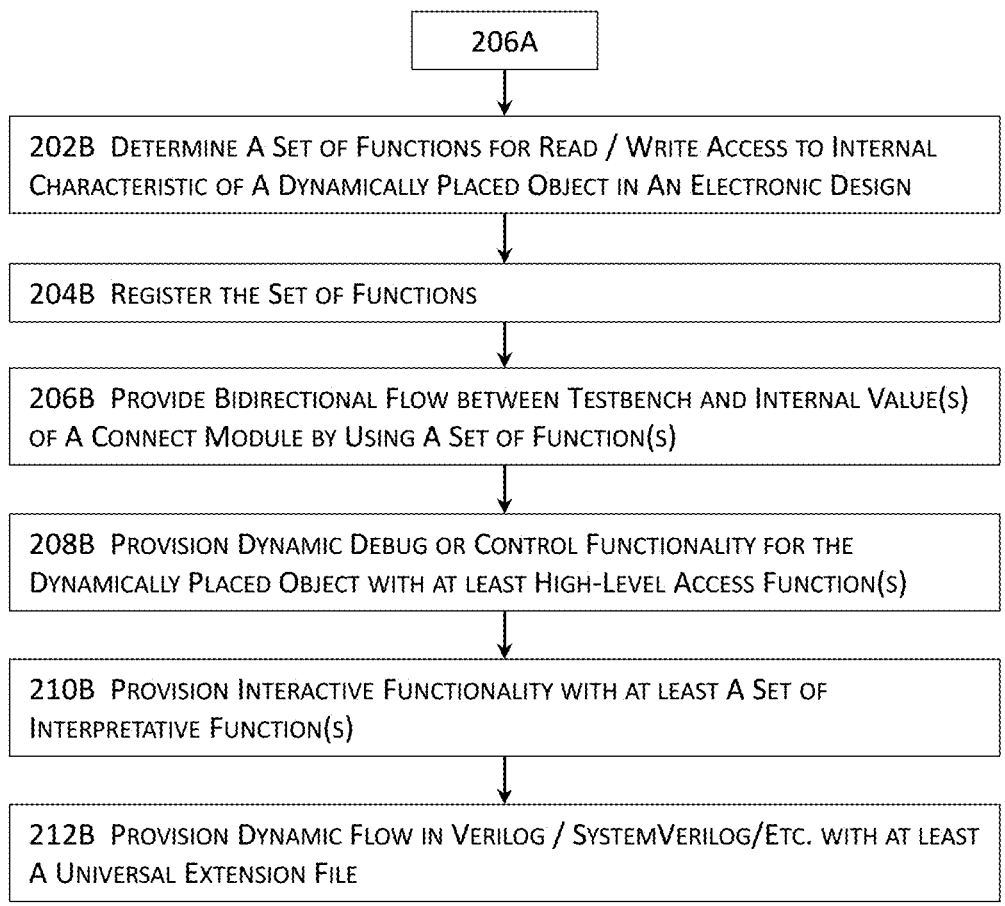
FIG. 2B illustrates more details about a portion of the high-level flow diagram illustrated in FIG. 2A in one or more embodiments.

FIG. 2B illustrates more details about a portion of the high-level flow diagram illustrated in FIG. 2A in one or more embodiments. Again, it shall be noted that although some examples or embodiments are described herein with reference to connect module, the same techniques may also be provided to other types of objects in an electronic design. Thus, the reference to connect module or connect modules is merely described herein as non-limiting examples. More specifically, FIG. 2B illustrates more details about identifying and provisioning for one or more dynamically placed objects (e.g., connect modules) at 206A of FIG. 2A. In these one or more embodiments, a set of functions for accessing one or more internal characteristics of a dynamically placed object in an electronic design may be determined at 202B. For example, a set of VPI (Verilog Procedural Interface) functions, Tcl functions, and/or any other suitable functions, etc. may be determined anew, identified from existing identical or similar functions, or modified or derived from one or more existing functions at 202B. The set of functions provide the users with the capability to, for example, read and/or write to one or more specific variables, one or more specific parameters, one or more settings, etc. inside the dynamically placed object in the electronic design. Moreover, a function in the set of functions may be predefined with an appropriate handle supported by any desired or required simulators, verification engines, etc. For example, a VPI function described herein may be predefined with a VPI handle supported by, for example, Verilog, SystemVerilog, and/or any RTL (register transfer layer) simulators, etc. with the following code/pseudo code.

```
vpiHandle thisTask, argl, argH;
thisTask=vpi_handle(vpiSysTfCall, NULL);
if (vpi_chk_error(NULL))
{
   vpi_printf("===VPI REPORT===ERROR: Could not get a handle to the task/func!\n);
}
argl=vpi_iterate(vpiArgument, thisTask);
if ((argH=vpi_scan(argl))
}
   if (vpi_get(vpiType, argH)==vpiStringVar){
      //store multiple different values in the object
      s_vpi_value storage_object;
      storage_object.format=vpiStringVal;
      s_vpi_value m_module_name;
      //store a pointer to the module name in the object
      s_vpi_value m_module_name;
      m_module_name.format=vpiStringVal;
      vpi_get_value(argH,&m_module_name);
      char *module_name;
      module_name=(char*) malloc(strlen(m_module_name.value.str)+1);
      strncpy(module_name, m_module_name.value.str, strlen(m_module_name.value.str)+1);
      //declare iterator and single object
      vpiHandle handle_scope_iterator;
      vpiHandle handle_scope_object;
      . . .
```

Verilog Procedural Interface (VPI) is a C-programming interface for the Verilog Hardware Description Language (HDL). VPI is the third-generation procedural interface to Verilog HDL (Verilog Hardware Description Language). VPI provides consistent, object-oriented access to the complete Verilog HDL. VPI includes a set of access and utility routines that you call from standard C programming language functions. These routines interact with the instantiated simulation objects contained in your Verilog HDL design. VPI is identical or substantially similar to Verilog PLI 1.0 and PLI 2.0, so if something is working in PLI 2.0, the same may be easily ported to VPI. VPI is cleaner than earlier PLI 2.0. All the functions and tasks start with vpi_*.

Moreover, in these one or more embodiments, the set of functions identified at 202B may be registered with an electronic design automation tool (e.g., a simulator, a debug tool, a verification tool, etc.) at 204B. Registering a function with an electronic design automation tool that manipulates an electronic design (e.g., editing, analyzing, debugging, verifying, etc. the electronic design) enables the electronic design tool to call the function from some or all connect modules in the electronic design.

For example, the following example VPI functions may be registered with an electronic design tool with the example code/pseudocode below.

```
static s_vpi_sustf_data systfTestList[ ]={
   {vpiSysTask, 0, "$register_param", register_param, 0, 0, 0},
   {vpiSysTask, 0, "$register_name", register_name, 0, 0, 0},
   {vpiSysTask, 0, "$Ilist_internal_values", list_internal_values, 0, 0, 0},
   {vpiSysTask, 0, "$update_cm_values", update_cm_values, 0, 0, 0},
   {vpiSysTask, 0, "$get_internal_values_from_cm", get_internal_values_from_cm, 0, 0, 0},
   {vpiSysTask, 0, "$cm_update_real_tcl", cm_update_real_tcl, 0, 0, 0},
   {0}
};
```

In some embodiments, the function "$register_name" may be implemented as shown in the following code/pseudocode.

```
int register_name( )
{
   vpiHandle thisTask, argI, argH;
   thisTask = vpi_handle(vpiSysTfCall, NULL);
   if (vpi_chk_error(NULL))
   {
      vpi_printf("===VPI REPORT=== ERROR: Could not get a handle to the task/func!\n");
      return(0);
   }
   argI = vpi_iterate(vpiArgument, thisTask);
   if (!(vpi_chk_error(NULL) || !argI))
   {
      if ( (argH = vpi_scan(argI)) )
      {
         if(vpi_get(vpiType,argH) == vpiStringVar ){
            s_vpi_value storage_object;
            storage_object.format = vpiStringVal;
            vpi_get_value(argH,&storage_object);
            svSetScope(svGetScopeFromName(UR_PATH));
            cmsv_reg_name_export_to_c(storage_object.value.str);
         }
      }
   }
   vpi_release_handle(thisTask);
   vpi_release_handle(argI);
   vpi_release_handle(argH);
   return(0);
}
```

In the above example code/pseudocode, "svSetScope(svGetScopeFromName(UR_PATH));" and "cmsv_reg_name_export_to_c(storage_object.value.str);" are invoked to set the scope and call SystemVerilog functions to register connect module(s) in a database and place the connect module(s) into an array. That is, once a function (e.g., a VPI function) is registered, the VPI function may be called from, for example, an electronic design automation tool. For example, the above VPI function $register_name may be called with, for example, "$register_name(module_name);" defined in, for example, a header file (e.g., CM20.h). This $register_name function receives a valid module name as an input and calls SystemVerilog function "cmsv_reg_name_export_to_c(storage_object.value.str);" as shown in the above example code/pseudocode.

At 206B, bidirectional flows between the electronic design (or testbench) and one or more internal characteristics of a connect module may be provided or ensured with an additional set of functions in some embodiments. For example, one or more SystemVerilog functions, one or more VPI functions, etc. may be identified, defined, or determined to ensure bidirectional flows between the electronic design (or testbench) and one or more internal characteristics of a connect module as listed in the following code/pseudocode.

```
typedef real real_hash_t [string]; //string ky—real value
typedef string string_hash_t [string]; //string key—string value
typedef int int_hash_t [string]; //string key—int value
typedef struct {
    real_hash_t real_value;
    string_hash_t string_value;
    int_hash_t int_value;
} data_struct;
typedef string string_array [ ];
struct {
    data_struct db [string]; //connect_module_name—(one to multiple)→parameter
    string_array hier_cm [string]; //data structure hier path—(one to multiple)→cm_n
    string_array rev_hier_cm [string]; //data structure cm_name—(one to one)→hier_path
} CM20_GLOBAL;

function automatic void cmsv_reg_name_export_to_c)
    input string module_name);
    data_struct empty_param_entry;
    empty_param_entry.real_value='{default: −1.0};
    empty_param_entry.string_value='{default: "N/A" };
    empty_param_entry.int_value='{default: −1};
    CM20_GLOBAL.db[module_name]=empty_param_entry;
endfunction: cmsv_reg_name_export_to_c
function automatic void cm_create_real(input string name, input string m_type, input real value);
    if(CM20_GLOBAL.db.exists(name)) begin
        CM20_GLOBAL.db[name].real_value[m_type]= value;
    end
endfunction: cm_create_real
. . .
```

The following example code/pseudocode further demonstrates a bidirectional flow with a VPI function ("cm_update_real").

```
function automatic int cm_update_real_sv(input string name, input string m_type, input real value);
    cm_update_real_sv=0;
    if(CM20_GLOBAL.db.exists(name)) begin
        if  (CM20_GLOBAL.db[name].real.value.exists (m_type)) begin
            CM20_GLOBAL.db[name].real_value[m_type]= value;
            $update_cm_values(name);
            cm_update_real_sv=1;
        end
    endfunction: cm_udpate_real_sv
```

In the aforementioned examples, CM20_GLOBAL is an intermediate storage (e.g., 116B in FIG. 1B), and "$update_cm_values(name)" is a C function.

Another example of bidirectional flow is demonstrated in the following example code/pseudocode with the function "$update_cm_values(name)" function that takes a valid module name as an input, iterates through all the variables of the module that are previously registered in a testbench and upload new values from the testbench to the correct module.

```
int update_cm_values( ) //Provide valid module name as an argument
{
  vpiHandle thisTask, argI, argH;
  thisTask = vpi_handle(vpiSysTfCall, NULL);
  if (vpi_chk_error(NULL)){
     vpi_printf("===VPI REPORT=== ERROR: Could not get a handle to the
        task/func!\n");
     return(0);
  }
  argI = vpi_iterate(vpiArgument, thisTask);
  if (argI){
     if ( (argH = vpi_scan(argI)) ){
        if(vpi_get(vpiType,argH) == vpiStringVar || vpi_get(vpiType,argH) ==
           vpiModule){
vpiStringVar);
           s_vpi_value m_module_name;
           m_module_name.format = vpiStringVal;
           if(vpi_get(vpiType,argH) == vpiModule) {
              m_module_name.value.str = vpi_get_str(vpiFullName,argH);
           }else{
              vpi_get_value(argH,&m_module_name);
           }
           char *module_name;
           module_name = (char*)malloc(strlen(m_module_name.value.str) + 1);
           strncpy(module_name, m_module_name.value.str,
        strlen(m_module_name.value.str)
   + 1);
           vpiHandle module_handle;
```

```
            module_handle = vpi_handle_by_name(module_name, NULL);
            vpiHandle handle_scope_iterator;
            handle_scope_iterator = vpi_iterate(vpiParameter, module_handle);
            vpiHandle handle_scope_object;
            while ( (handle_scope_object = vpi_scan (handle_scope_iterator)) ) {
                if(vpi_get(vpiConstType,handle_scope_object) == vpiRealConst || vpi_get
(vpiConstType,handle_scope_object) == vpiStringConst){
                    char *prepend = "m_";//Pointer to a char containing m_
                    char *mult_name;
                    if( (mult_name = (char*)malloc(strlen(vpi_get_str(vpiName,
handle_scope_object)) + strlen(prepend) + 1)) != NULL ){
                        mult_name[0] ='\0';
                        strcat(mult_name, prepend);
                        strcat(mult_name, vpi_get_str(vpiName, handle_scope_object));
                    } else {
                        vpi_printf ("===VPI REPORT=== ERROR: Memory allocation error.");
                    }
                    vpiHandle var_iterator_handle;
                    vpiHandle single_var_handle;
                    var_iterator_handle = vpi_iterate(vpiVariables, module_handle);
                    while ( (single_var_handle = vpi_scan (var_iterator_handle)) ) {
                        char *single_var_name = vpi_get_str(vpiName, single_var_handle);
                        if(!strcmp(mult_name, single_var_name)){
                            if(vpi_get(vpiType,single_var_handle) == vpiRealVar){
                                svSetScope(svGetScopeFromName(UR_PATH));
                                double value1;
                                cm_read_real(module_name, single_var_name, &value1);
                                s_vpi_value mult_val;
                                mult_val.format = vpiRealVal;
                                mult_val.value.real = value1;
                                vpi_put_value(single_var_handle, &mult_val, NULL, vpiNoDelay);
                            }
                        }
                    }
                }
            }
            vpi_release_handle(module_handle);
        }
        else {
            vpi_printf("===VPI REPORT=== ERROR: Arg is not a vpiStringVar!\n");
            return (0);
        }
    }
    }
    else {
        vpi_printf("===VPI REPORT=== ERROR: Unable to get args iterator!\n");
        return(0);
    }
    vpi_release_handle(argH);
    vpi_release_handle(argI);
    vpi_release_handle(thisTask);
    return(0);
}
```

The connect module framework may provision, at 208B, a set of one or more high-level access functions for dynamic debugging and/or control functionality for the dynamically placed object in the electronic design. In some embodiments, one or more functions from SystemVerilog, Verilog, etc. may be exported to the connect module framework. The connect module framework may enable the registration of these one or more functions (e.g., by providing an intermediate layer to register these one or more exported functions) so that these one or more exported functions may be launched from the connect module framework to perform their respective functionalities with respect to connect modules in the electronic design. For example, the following example functions may be exported to, for example, C code with the code/pseudocode below:

export "DPI" function cm_create_real;
  export "DPI" function cm_create_string;
  export "DPI" function cm_read_real;
  export "DPI" function cm_update_real;
  export "DPI" function cm_read_string;
  export "DPI" function cm_update_string;
  export "DPI" function cmsv_reg_name_export_to_c;

The aforementioned C code provides access to the set of one or more functions, which may be launched from the C code, to perform various manipulations on the dynamically placed object. This C code may thus serve as the aforementioned intermediate layer, and the above may be achieved with the following code/pseudocode in some embodiments.

include <studio.h>
  #include <stdlib.h>
  #include <string.h>
  #include <vpi_ams.h>
  #include <vpi_user.h>
  #include <vpi_user_cds.h>
  #include <svdpi.h>
  #include <sv_vpi_user.h>
  #include <cfclib.h>
  #ifndef UR_PATH
  #define UR_PATH "CM20_pkg: :"
  #endif int register_param( );
int register_name( );
int register_internal_values( );
int get_internal_value_from_cmo;
int update_cm_values( );
void setup_user_function( );
int cm_update_real_tcl( );
//Functions exported from SystemVerilog
void cm_create_real( );
void cm_create_string( );
void cm_read_real( );
void cm_update_real( );
void cmsv_reg_name_export_to_c( );

In some embodiments, the connect module framework may further provision a set of one or more interpretative functions at 210B to provide their respective functionalities for implementing an electronic design using connect modules with dynamic and interactive control. For example, the connect module framework may provision a set of one or more Tcl functions to enable, for example, interactive use models of the connect module framework with respect to the dynamically placed object and/or the electronic design. For example, the connect module framework may provision the Tcl function "cm_update_real_tcl" for dynamic and interactive control as illustrated in the following code/pseudo-code. With the Tcl function, connect module name may be written, instead of sending a string, to the Tcl function, and the Tcl console may send the VPI object that corresponds to the provided connect module name.

```
Static s_vpi_systf data systfTestList[ ]={
    =5 vpiSysTask, 0, "$register_param", register_param,
        0, 0, 0},
    {vpiSysTask, 0, "$register_name", register_name, 0, 0,
        0},
    {vpiSysTask, 0, "$Ilist_internal_values", list_internal-
        _values, 0, 0, 0},
    {vpiSysTask,    0,    "$update_cm_values",    update-
        _cm_values, 0, 0, 0},
    {vpiSysTask, 0, "$get_internal_values_from_cm",
        get_internal_values_from_cm, 0, 0, 0},
    {vpiSysTask, 0, "$cm_update_real_tct", cm_updat-
        e_real_tct, 0, 0, 0},
        {0}
};
```

Tcl is a high-level, general-purpose, interpreted, dynamic programming language and supports multiple programming paradigms, including, for example, object-oriented, imperative, and functional programming or procedural styles. In some embodiments, Tcl may be used embedded into C applications scripted applications, GUIs (Graphical User Interfaces), and/or testing, etc. In some embodiments, a Tcl interpreter may be embedded into or externally coupled to the connect module framework.

At 212B, the connect module framework may provision an extension file to provide dynamic flow capabilities. For example, a respective extension file or an universal extension file for a plurality of environment (e.g., Verilog-AMS, SystemVerilog-AMS, etc.) to enable dynamic flows during which user or the software tools (e.g., simulators, verification tools, etc.) may dynamically (e.g., during the execution of the testbench, simulation, etc.) perform various functions described here, without waiting for the current analysis flow to complete.

Figure 3A:
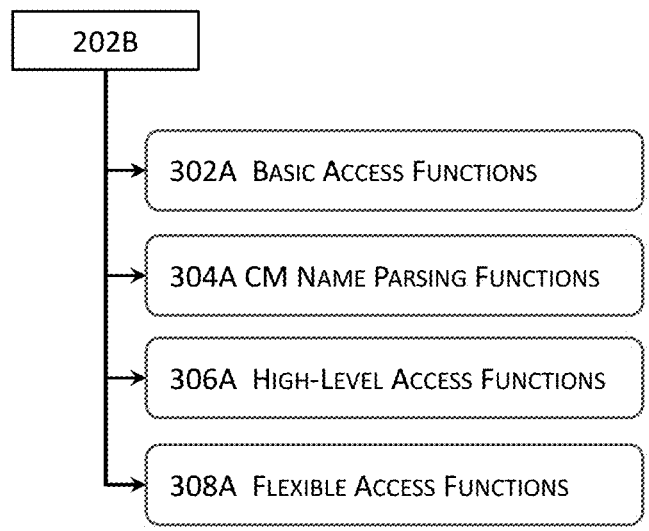
FIG. 3A illustrates more details about a portion of the high-level flow diagram illustrated in FIG. 2B in one or more embodiments.

FIG. 3A illustrates more details about a portion of the high-level flow diagram illustrated in FIG. 2B in one or more embodiments. More specifically, FIG. 3A illustrates some example sets of functions provided by the connect module framework. In these one or more embodiments, the set of functions determined at 202B may include one or more sets of a set of basic access functions 302A, a set of connect module name parsing functions 304A, a set of high-level access functions 306A, or a set of flexible access functions 308A. More details about each of these sets of functions will be described below with reference to FIGS. 3B-3E. In these embodiments, any of the set of functions determined at 202B support interactive, dynamic, and/or static use models.

Figure 3B:
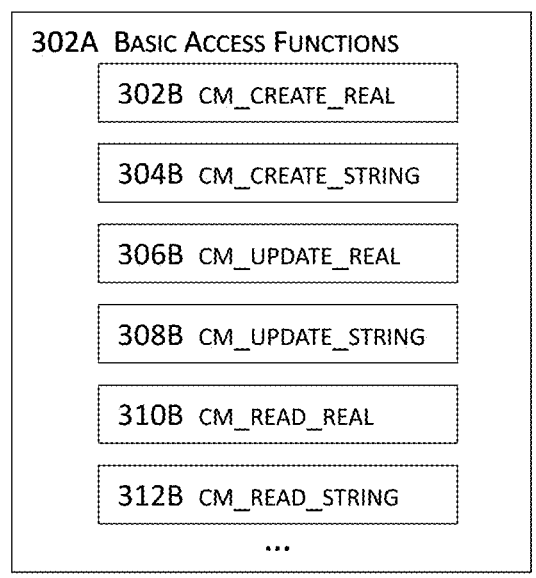
FIG. 3B illustrates more details about a portion of FIG. 2A for implementing an electronic design using connect modules with dynamic and interactive control in one or more embodiments.

FIG. 3B illustrates more details about a portion of FIG. 2A for implementing an electronic design using connect modules with dynamic and interactive control in one or more embodiments. More specifically, FIG. 3B illustrates an example set of basic access functions 302A in FIG. 3A.

In these one or more embodiments illustrated in FIG. 3B, the set of basic access functions may include one or more of a "cm_create_real" function 302B for creating (e.g., declaring) one or more real variables, a "cm_create_string" function 304B for declaring one or more string variables, a "cm_update_real" function 306B for updating (e.g., writing) one or more real variables, a "cm_update_string" function 308B for updating (e.g., writing) one or more string variables, a "cm_read_real" function 310B for accessing (e.g., reading) one or more real variables, or a "cm_read_string" function 312B for accessing (e.g., reading) one or more string variables.

Figure 3C:
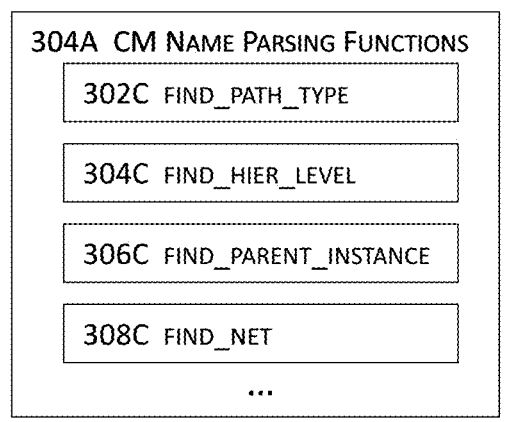
FIG. 3C illustrates more details about a portion of FIG. 2A for implementing an electronic design using connect modules with dynamic and interactive control in one or more embodiments.

FIG. 3C illustrates more details about a portion of FIG. 2A for implementing an electronic design using connect modules with dynamic and interactive control in one or more embodiments. More specifically, FIG. 3C illustrates an example set of connect module name parsing functions 304A in FIG. 3A.

In these one or more embodiments illustrated in FIG. 3C, the set of connect module name parsing functions may include one or more of a "find_path_type" function 302C for identifying the type of a path of a connect module, a "find_hier level" function 304C for determining one or more hierarchical levels pertaining to a connect module (e.g., the hierarchical level at which the connect module is located, or one or more parent hierarchical levels, etc.), a "find_parent_instance" function 306C for identifying the parent instance of a connect module, or a "find_net" function 308C for determining a net or net segment along which a connect module is located.

Figure 3D:
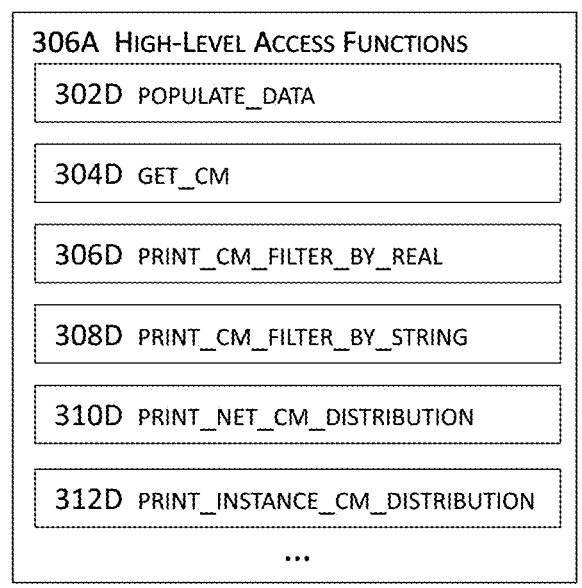
FIG. 3D illustrates more details about a portion of FIG. 2A for implementing an electronic design using connect modules with dynamic and interactive control in one or more embodiments.

FIG. 3D illustrates more details about a portion of FIG. 2A for implementing an electronic design using connect modules with dynamic and interactive control in one or more embodiments. More specifically, FIG. 3D illustrates an example set of high-level access functions 306A in FIG. 3A.

In these one or more embodiments illustrated in FIG. 3D, the set of high-level access functions may include one or more of a "populate_data" function 302D for populating data into a connect module, a "get_cm" function 304D for obtaining one or more connect modules based at least in part upon one or more arguments passed into the "get_cm" function 304D, a "print_cm_filter by_real" function 306D for identifying and displaying one or more connect modules based at least in part upon a real value or variable, a "print_cm_filter by_string" function 308D for identifying and displaying one or more connect modules based at least in part upon a real value or variable, a "print_net_cm_distribution" function 310D for identifying and displaying one or more nets or net segments pertaining to one or more connect modules, or a "print_instance_cm_distribution" function 312D for identifying and displaying one or more instance pertaining to one or more connect modules.

Figure 3E:
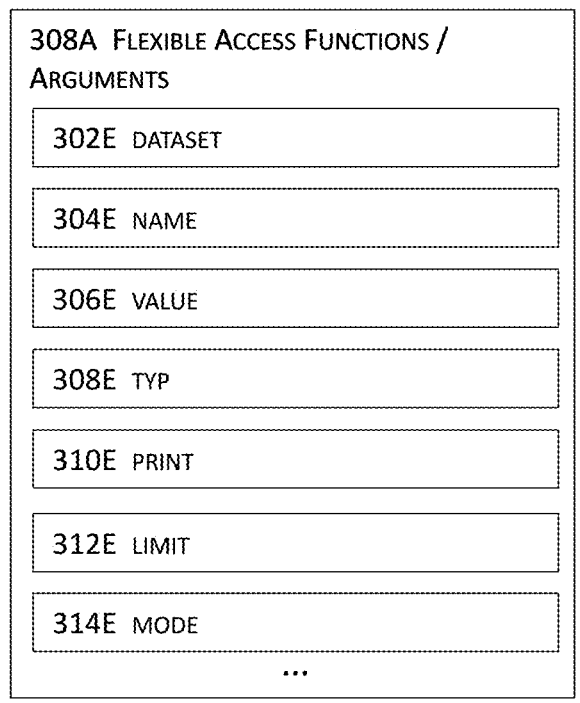
FIG. 3E illustrates more details about a portion of FIG. 2A for implementing an electronic design using connect modules with dynamic and interactive control in one or more embodiments.

FIG. 3E illustrates more details about a portion of FIG. 2A for implementing an electronic design using connect modules with dynamic and interactive control in one or more embodiments. More specifically, FIG. 3E illustrates an example set of flexible access functions 308A in FIG. 3A.

In these one or more embodiments illustrated in FIG. 3E, the set of high-level access functions may include one or more of a "dataset" function 302E (e.g., "input string_array dataset,") for identifying one or more datasets upon which operations may be performed. In addition, FIG. 3E includes a plurality of arguments that may be passed into one or more functions. These arguments may include, for example, a "name" argument 304E (e.g., "input string_array name,") for identifying a name of a parameter, a variable, a setting, etc., a "value" argument 306E (e.g., "input string_array value,") for identifying or declaring a value of a parameter, setting, variable, etc., a "typ" argument 308E (e.g., "input string_array typ,") for identifying or declaring a type of a variable (e.g., a string type, a real type, etc.), a "print" argument 310E (e.g., "input string print="name") for printing data using arguments such as "none," "all," "name," or "parameter," etc., a "limit" argument 312E (e.g., "input int limit=100) for printing no more than the input value (e.g., 100 in the above example) specified in the limit argument 312E, or a "mode" argument 314E (e.g., input string_array mode,") for a comparison mode to compare whether an actual design value and the value specified in the input argument are equal ("eq"), the actual design value is larger ("ht") than the value specified in the input argument, or the actual design value is smaller than ("lg") the value specified in the input argument.

Figure 4A:
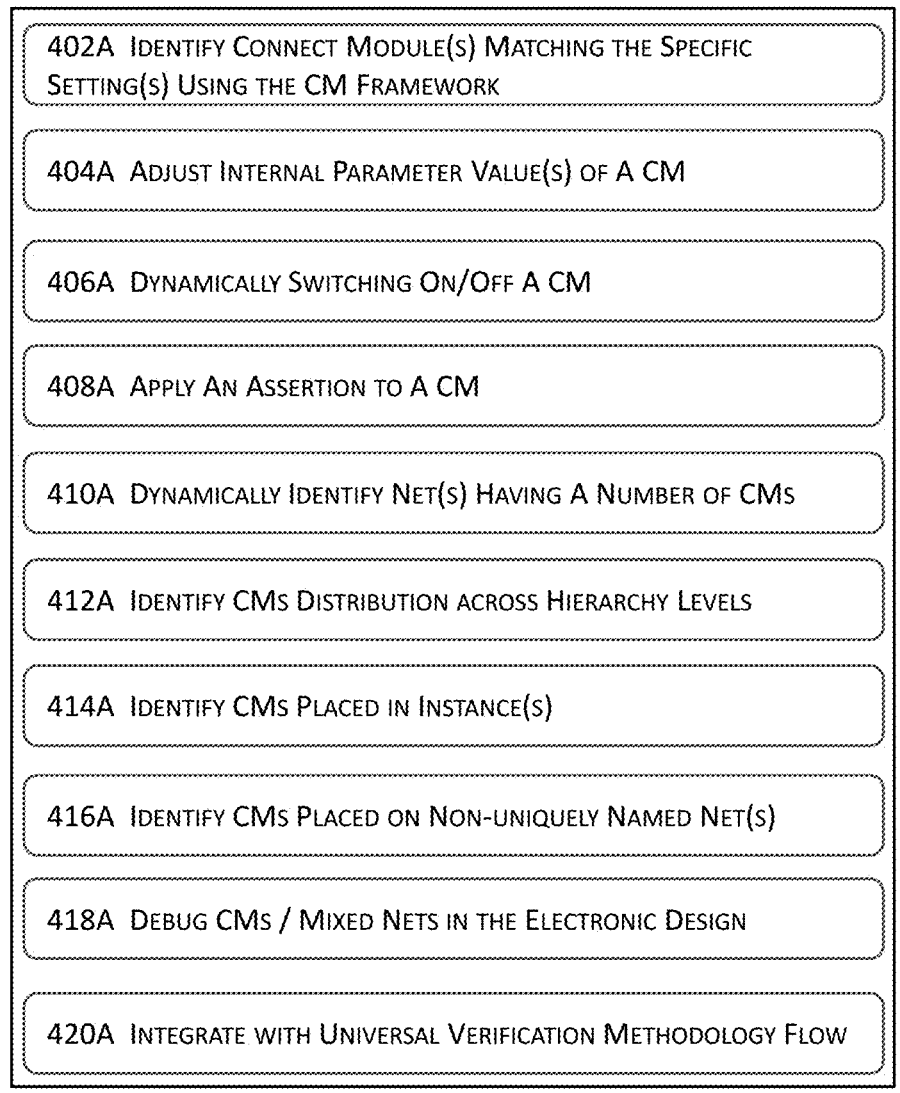
FIG. 4A illustrates some example functionalities provided by a connect module framework described herein in one or more embodiments.

FIG. 4A illustrates some example functionalities provided by a connect module framework described herein in one or more embodiments. In these one or more embodiments, the connect module framework described herein may provide the functionality 402A for identifying one or more modules that match one or more specific settings, values, etc. For example, the following code/pseudocode may be used to list connect modules with the settings vsup=5.0, currentmode=0.0, cm_type=EM_bidir, rout>0 and print the name (s), parameter value(s), etc. for an electronic design.

```
name_arr={"vsup", "currentmode", "cm_type", "rout" };
value_arr={"5.0", "0.0", "ER_bidir", "0" };
typ_arr={"real", "real", "string", "real" };
mode_arr={"eq", "eq", "eq", "ht" };
print_mode="parameter";
void'(get_cm) .dataset(all_cm), .name(name_arr), .value
    (value_arr), .typ(typ_arr), .mode(mode_arr), .print
    (print_mode), .limit(print_limit)))
```

The connect module framework described herein may provide the functionality 404A for adjusting one or more internal parameter values of a connect module. This functionality 404A enables reading and modifying values inside connect modules. For example, the following code/pseudocode may be used to adjust m_idelta for and m_vdelta for connect modules in a current mode ("currentmode") in an electronic design. In this example, connect modules in "currentmode" are identified, and the values of real variables "m_idelta" and "m_vdelta are updated into 1e-2 inside the identified connect modules.

```
currentmode_cm={ };
currentmode_cm=print_cm_filter    by_real("current-
    mode",
    1.0, .mode("eq"), .data("none"));
$display("Currentmode connect modules found: % d",
    currentmode_cm.size( );
foreach(currentmode_cm[i]) begin
    name=currentmode_cm[i];
    cm_update_real_sv(name, "m_idelta", 1e-2);
    cm_update_real_sv(name, "m_vdelta", 1e-2);
    $display("% s", name);
end
```

The connect module framework described herein may provide the functionality 406A for dynamically controlling a connect module. The following code/pseudocode illustrates the functionality 406A by switching a connect module on or off. This example demonstrates the functionality to statically, dynamically, and/or interactively controlling connect modules by, for example, shutting down connect module(s), turning on connect module(s), etc.

```
assign shut=(conversion_cycle==ACTIVE ) ? 0.0: 1.0;
L2E_2_cm={ };
L2E_2_cm=print_cm_filter    by_string("cm_type",
    "L2E_2", .data("none"));
$display("Currentmode connect modules found: % d",
    currentmode_cm.size( );
always @(shut)
    foreach(L2E_2_cm[i]) begin
        name=L2E_2_cm[i];
        cm_update_real_sv(name, "m_cm_disable", shut);
    end
```

The connect module framework described herein may provide the functionality 408A for applying an assertion to a connect module. The following code/pseudocode illustrates the functionality 408A by applying a SystemVerilog assertion to connect module data. In this example, the SystemVerilog assertion "assert vsup >GLOBAL.vmin", which conventionally requires prior knowledge of the user about the names of connect module instances without the present disclosure, may be efficiently asserted by leveraging the capabilities of dynamically determining the connect modules in an electronic design described herein while allowing static and dynamic updates or modifications of any connect modules. The following example further demonstrates identifying all logic-to-electrical (L2E) to connect modules (CM) to which one or more assertions may be applied.

```
assign shut=(conversion_cycle==ACTIVE ) ? 0.0: 1.0;
L2E_2_cm={ };
L2E_2_cm=print_cm_filter_by_string("cm_type",
    "L2E_2", .data("none"));
$display("Currentmode connect modules found: % d",
    currentmode_cm.size( );
always @(shut )
foreach(L2E_2_cm[i]) begin
    name=L2E_2_cm[i];
    cm_update_real_sv(name, "m_cm_disable", shut);
end
```

Once the logic-to-electrical connect modules have been identified, these logic-to-electrical (L2E) connect modules may be placed into a dynamic array (e.g., L2E_CM) by using the above example code/pseudocode for a reporter module (e.g., L2E_CM_reporter). In some embodiments, a reporter module may be used to, for example, check the existence of a variable in an instance of connect module by calling, for example, "c_SNCC_failure_list=print_cm_filter_by_real("m_shadow_network_consistency_check", 0.0, "ht", "none");". The reporter module may then return a list of connect modules with the variable "m_shadow_network_consistency_check" that has a greater than zero (0) value. Moreover, the returned list may include connect modules in which this variable is present. In some embodiments, connect modules of the type "L2E" (logic to electrical) having the aforementioned variable present need not be filtered by type because such filtering is already done implicitly. Assertions may then be applied to output of the reporter module.

```
module L2E_CM_reporter
    import CM20_pkg::*;
        (output wire c_SNCC,
        output wire c_NZDCC,
        input wire sampl);
    string_array c_SNCC_failure_list;
    string_array c_NZDCC_failure_list;
    logic c_SNCC_status;
    logic c_NZDCC_status;
    int num;
    initial begin
        c_SNCC_status=1'b0;
        c_NZDCC_status=1'b0;
    end
    always @(sampl) begin
        c_SNCC_failure_list=print_cm_filter_by_real(
    "m_shadow_network_consistency_check", 0.0, "ht",
    "none");
        if (c_SNCC_failure_list.size( )>0) begin
            c_SNCC_status=1'b1;
            num=c_SNCC_failure_list.size( );
        end
        c_NZDCC_failure_list=print_cm_filter    by_real
            ("m_drivers_count_check", 0.0,
    "eq", "none");
        if (c_NZDCC_failure_list.size( )>0) begin
            c_NZDCC_status=1'b1;
            num=c_NZDCC_failure_list.size( );
        end
    end
    assign c_SNCC=c_SNCC_status;
    assign c_NZDCC=c_NZDCC_status;
endmodule
```

The connect module framework described herein may provide the functionality 410A for dynamically identifying one or more nets that have a number of connect modules. The following code/pseudocode illustrates the functionality 410A for listing the nets having more than one connect module inserted.

Hier path is >>tb.\csd_globals.gnd!<< and the name is >>Bidir_2_logic <<
Hier path is >>tb.\csd_globals.gnd!<< and the name is >>E2L_2_logic <<
< . . . >
Hier path is >>tb.XXX.VDD_MV<< and the name is >>Bidir_2_logic <<
Hier path is >>tb.XXX.VDD_MV<< and the name is >>E2L_2_logic <<
Total amount of nets with >1 CMs is: 18

The connect module framework described herein may provide the functionality 412A for populating and printing hierarchical levels data. For example, the functionality 412A may print the respective numbers of connect modules found at one or more hierarchical levels in an electronic design. The connect module framework described herein may provide the functionality 414A for identifying connect module(s) inserted into a specific instance. For example, functionality 414A may identify and print, for a specific instance, the total number of connect modules inserted into the specific instance, or even further more detailed information (e.g., the respective names of the connect modules, the net(s) along which the connected modules are inserted, etc.) The connect module framework described herein may provide the functionality 416A for identifying connect module(s) inserted in one or more non-uniquely named nets.

The connect module framework described herein may provide the functionality 418A for debugging one or more connect modules and/or one or more mixed nets. For example, the following code/pseudocode may be used to list all connect modules that failed a "cged_tolerance_check" that performs a check for the input logic value of L2E_* class of connect modules against a mapped shadow network logic value.

```
'cged_tolerance_check(A, B, CGED, VSTATE, VHI,
    VL0, TOL, NANEM, MNAME)
    foreach (db[cm_name])
        if(cm_read_real_sv(cm_name, "m_shadow_real_con-
            sistency_check")==1.0
        $display("db[%0s]=% p\n", cm_name, db[cm_
            name]);
```

In the above example code/pseudocode, "'cged_tolerance_check(A, B, CGED, VSTATE, VHI, VL0, TOL, NANEM, MNAME)" denotes the code for a Verilog-AMS connect module; and the code "foreach (db[cm_name]) . . . " denotes SystemVerilog code. Moreover, in the above example code/pseudocode, a macro definition may state for:

```
'define cged_tolerance_check(A, B, CGED, VSTATE,
    VHI, VL0, TOL, NAME, MNAME)\
    parameter real NAME=0.0; \
    real MNAME=0.0; \
    always @(A, B) begin \
        if(CGED && $realtime >0) begin \
            #0; \
            if (((A==0) && (abs(VSTATE-VL0)>TOL))||
                ((A==1) &&
                (abs(VSTATE-VHI)>TOL))) MNAME=1.0; \
            else MNAME=0.0; \
        end \
    end
```

In the above example, the macro definition "'define cged . . . " denotes the code for a Verilog-AMS connect module; and the remainder beginning with "always @(A, B) . . . " denotes SystemVerilog code.

As another example, the debugging capability for connected modules and/or mixed nets (418) may also debug connectivity issues or dangling connect modules (e.g., a connect module placed with reverse port directions, connect modules having more than one driver, etc.) with the following example code/pseudocode.

```
'drivers_count_check(A, NAME, MNAME)
    foreach(db[cm_name])
        if (cm_read_real_sv(cm_name, "m_discrete_output_
            drivers_num")>1.0)
        $display("db[%0s]=% p\n", cm_name, db[cm_
            name]);
```

Another example of the debug connectivity issues or dangling connect modules (418) for debugging connect modules with no discrete input drivers (e.g., unexpected ER_bidir connect module placement, user-defined nettype(s), etc.) may be achieved with the following code/pseudocode.

```
'drivers_count_check(A, NAME, MNAME)
    foreach(db[cm_name])
        if (cm_read_real_sv(cm_name, "m_discrete_output_
            drivers_num")==0.0)
        $display("db[%0s]=% p\n", cm_name, db[cm_
            name]);
```

Another example of the debug connectivity issues or dangling connect modules (418) for debugging connect modules whose outputs are not within one or more tolerances of one or more corresponding driven values may be achieved with the following code/pseudocode.

```
'value_tolerance_check(A, B, CGED, VTOL, NAME,
    MNAME)
foreach(db[cm_name])
    if (cm_read_real_sv(cm_name, "m_tolerance_check")
        ==1.0)
        $display("db[%0s]=% p\n", cm_name, db[cm_
            name]);
```

Another example of the debug connectivity issues or dangling connect modules (418) for debugging connect modules is to disable (or enable) an electrical part (or a logic part) of connect modules may be achieved with the following code /pseudocode. One advantage of disabling an electrical part (or a logic part) of one or more connect modules is to improve the speed of analysis and conservation of compute resources.

```
'enable_disable (A, B, NAME, MNAME)
foreach(db[cm_name])
    if    (cm_read_string_sv(cm_name,    "cm_type")
        =="L2E_2")
        cm_update_real_sv(cm_name,    "m_cm_disable",
            1.0);
```

The connect module framework described herein may be integrated with other workflows (420) such as one or more of a universal verification methodology flow, etc. The connect module frame described herein may be integrated with other libraries (420) such as the resource libraries of the universal verification methodology by, for example, issuing pointers to these other libraries. In addition or in the alternative, the connect module framework may provide fault insertion on mixed-domain boundaries and may track and modify any variables, parameters, values thereof, etc. inside connect modules statically as well as debug mixed-net (e.g., a net spanning across both digital and analog disciplines and/or dynamically. The connect module framework also allows users to define their own attributes and provide seamless integration with "ie browser".

Figure 4B:
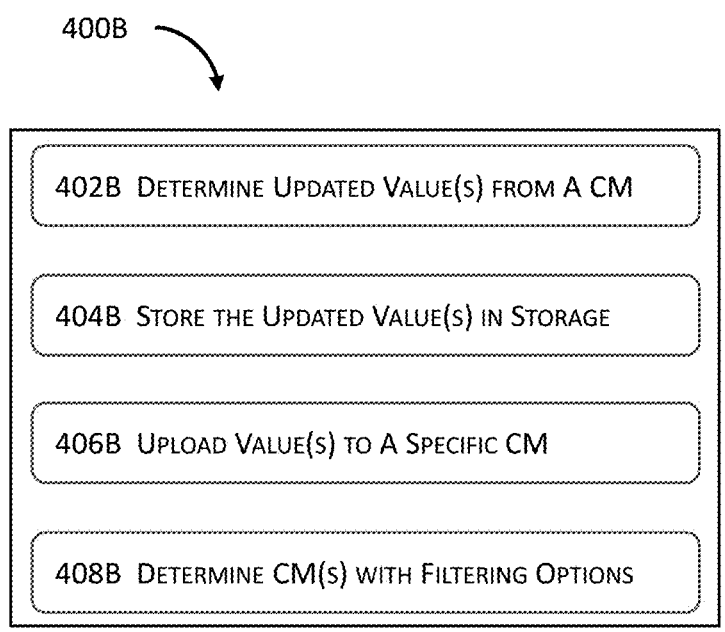
FIG. 4B illustrates some additional example functionalities provided by a connect module framework described herein in one or more embodiments.
Figure 5:
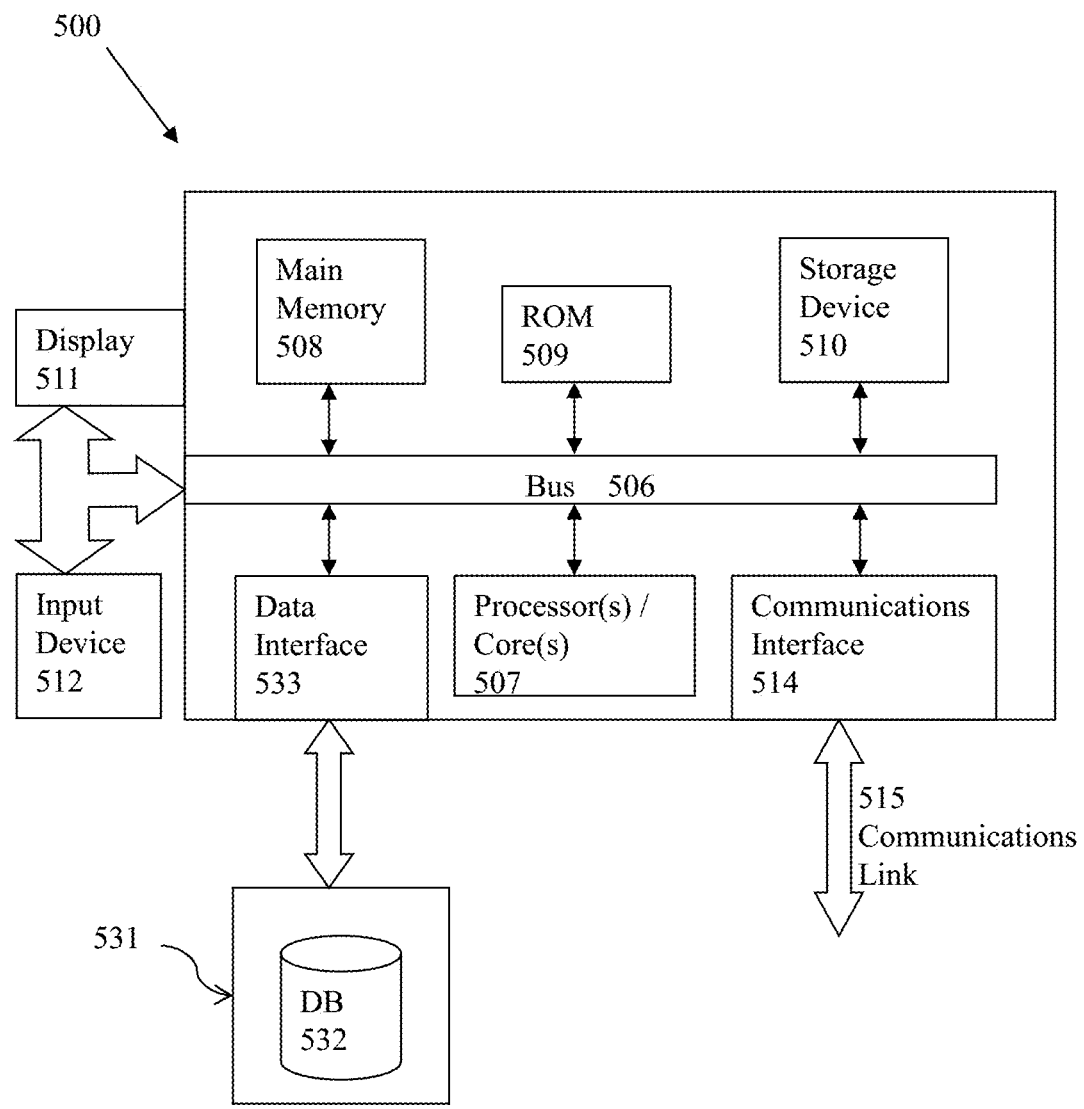
FIG. 5 illustrates a computerized system on which a process for implementing an electronic design using connect modules with dynamic and interactive control may be implemented.

FIG. 4B illustrates some additional example functionalities provided by a connect module framework described herein in one or more embodiments. More specifically, FIG. 4B illustrates some example interactive functionalities 400B provided a connect module described herein. It shall be noted that some or all of the functionalities illustrated in FIGS. 4A-4B may be performed statically, dynamically, and/or interactively before, during, or after a currently executing analysis of an electronic design of interest, without re-elaborating any part of the electronic design and without interrupting the analysis to continue to completion even with modifications to one or more internal characteristics of a connect module in the electronic design. In these one or more embodiments, the connect module framework may interactively iterative through all connect modules in an electronic design of interest and determine one or more specific values or updates thereof (402B) based at least in part a user's custom input.

With the functionality 402B, the connect module framework may, for example, iterate through and list all connect modules, access one or more specific parameters, variables, settings, etc. and/or one or more corresponding values thereof and compare the one or more specific parameters, variables, settings, etc. and/or one or more corresponding values thereof inside one or more connect modules to or with a specific (e.g., user-provided) value to determine whether the one or more specific parameters, variables, settings, etc. and/or one or more corresponding values thereof is greater than, equal to, or smaller than the specific value. For example, the connect module framework may obtain updated value(s) from one or more specific connect modules in all hierarchical levels (or in one or more specific hierarchical levels) with the following code/pseudocode. It shall be noted that this get_internal_values_from_cm function in the following code/pseudocode may be called from, for example, a simulator's shell (e.g., TCL shell) in some embodiments and may be natively called from SystemVerilog-AMS in some other embodiments.

call get_internal_values_from_cm full.hier.cm.name

In some embodiments, the connect module framework may further store any of the results of interactive use models into one or more flexible data structures (404B). For example, the connect module framework may store one or more updated value in a storage with the following code/pseudocode. It shall be further noted that the cm_update_real function in the following code/pseudocode may be called from, for example, a simulator's shell (e.g., TCL shell) in some embodiments and may be natively called from SystemVerilog-AMS in some other embodiments.

call cm_update_real full.hier.cm.name \"variable.name\" variable.value

In some embodiments, the connect module framework may also upload one or more values to one or more specific connect modules (406B) with the following example code/pseudocode. Like the get_internal_values_from cm function and cm_update_real function described above, this function update_cm_values function may be called from, for example, a simulator's shell (e.g., TCL shell) in some embodiments and may be natively called from SystemVerilog-AMS in some other embodiments.

call update_cm_values full.hier.cm.name

In some embodiments, the connect module framework may determine one or more connect modules that satisfy one or more filtering criteria (408B) with the following example code/pseudocode. Similar to the three functions described above, these print_cm_filter_by_string function and print_cm_filter by_real function in the following code/pseudocode may be called from, for example, a simulator's shell (e.g., TCL shell) in some embodiments and may be natively called from SystemVerilog-AMS in some other embodiments.

call print_cm_filter by_string \"name\" \"data\" \"value\" limit call print_cm_filter by_real \"name\" \"mode\" \"data\" \"value\" limit Various interactive use models provisioned by the connect module framework provide more flexibility in implementing electronic designs having connect modules. For example, any code from a dynamic use model may be used with custom code as shown in the following example code/pseudocode. Again, dynamic use model in the following code/pseudocode may be invoked from, for example, a simulator's shell (e.g., TCL shell) in some embodiments and may be natively invoked in SystemVerilog-AMS in some other embodiments.

```
int list_all_cms=0,
always @(list_all_cms) begin
    // insert custom code here //
end
```

Then a user may use "force list_all_cms=1" when a list of connect modules is needed for the aforementioned code. In some embodiments, the connect module framework may call Verilog, SystemVerilog, etc. functions out of Tcl using, for example, one or more VPI wrappers. In some embodiments, the connect module framework may call Tcl functions out of, for example, Verilog, SystemVerilog, etc. by using, for example, DPI-C(SystemVerilog Direct Programming Interface with foreign language such as C, C++, SystemC, etc.) and libraries. In some embodiments, consoles in other programming language (e.g., Python) may be embedded into the connect module framework and may be called with, for example, Tcl functions while having access to data in Verilog, SystemVerilog, etc.

The present application address at least the aforementioned inability and shortcomings of conventional approaches and provides various techniques for implementing an electronic design using connect module with dynamic and/or interactive control over any of the connect modules. The present application provides a set of full hierarchical names of connect modules that are currently placed in an electronic design at any stage. For example, connect modules are dynamically generated and placed into an electronic design during a simulation, the present application provides, at any given instant even during the simulation, the techniques to generate the identifications and/or the full hierarchical names (e.g., a hierarchical name including the current and one or more parent hierarchies of a connect module) of connect modules that have been placed into the electronic design although one or more connect modules may be further generated at a later time.

The present application also provides a set of functions (e.g., Verilog or SystemVerilog functions) in a non-Verilog environment (e.g., a debugger, a simulation engine, a verification engine, a testbench, etc.) so that these functions that are non-native in the non-Verilog environment may be invoked statically or dynamically during runtime. In addition, any of the modules, functions, techniques, etc. described in present application are reusable, extendable, and flexible and can be modified, asserted, enabled, and/or disabled at any time (e.g., during the execution of a simulation, verification, etc.) The present application further provides both a set of lower level functions to access (e.g., read and write access) and/or to control any connect modules (e.g., to read, write, and/or otherwise control an internal variable inside of a connect module) higher level functions to allow easy debugging and control. More details about the present application are described above.

As described above, a connect module may be placed in an electronic design during verification or simulation when a signal transitions from one discipline into a different discipline. A connect module is a software block of electronic circuit component designs that supports transition between two disciplines so the connect module may convert, for example, a digital domain signal into an electrical domain signal. Nonetheless, the placement of a connect module cannot be known in advance because designers generally do not know which discipline(s) a net may run into ahead of time.

For example, a digital inverter in the digital domain may be needed as a SPICE view (and hence an electrical model producing an output ranging from, e.g., 0V -1.8V). In this example, the neighboring circuit components of the digital inverter are digital, yet an electrical model is needed for the digital inverter to support the SPICE view. Therefore, a connect module may be used to bridge the electrical domain and the digital domain. Without using a connect module, such conversion will have to be manually performed by a designer. This manual conversion poses no difficulties when there is one or only a few of such components. Unfortunately, a typically-sized electronic design often tends to have at least many thousands, if not more, of such circuit components to prohibit any manual identification and conversion between domains.

In some embodiments, a process flow for implementing an electronic design using connect modules with dynamic and/or interactive control over any of the connect modules includes at least the following acts. A set of VPI (Verilog Procedural Interface) functions that enable read and/or write access to one or more variables and/or one or more parameters in a dynamically placed object in an electronic design may be generated. A dynamically placed object may include, for example, a connect module that receives one input in a first discipline and produces an output in a second discipline of a plurality of disciplines. The plurality of disciplines may include, for example, logic, real, wreal, bit, and/or user-defined, etc.

A set of data flow functions (e.g., one or more Verilog, SystemVerilog, and/or VPI functions, etc.) may be generated to ensure bidirectional data flow between an internal value stored in a dynamically placed object and a portion a testbench or an electronic design. Moreover, a set of high-level access functions (e.g., one or more Verilog, SystemVerilog, etc. functions) may be generated to provide debugging and/or control capabilities in a dynamic and/or interactive environment (e.g., during runtime of a simulation or verification).

In addition, a set of interactive functions (e.g., one or more functions in a high-level, general-purpose, interpreted, dynamic programming language such as Tcl, etc.) may be generated to provide interactive control over a connect module or a variable or a parameter thereof. For example, a designer may invoke a Tcl console of a simulation tool to apply any of the interactive functions to control one or more connect modules or any aspects thereof.

Furthermore, an extension file (e.g., a universal extension file such as a header file, CM20.h, described above) may be generated in such a way that this extension file may be used in different simulation tools, verification tools, debug tools, Verilog-AMS (analog, mixed-signals), SystemVerilog-AMS, etc. to enable dynamic flow of data and controls.

The following examples demonstrate how the present application provides dynamic and interactive control over connect modules and any aspects (e.g., variables, parameters, etc.) thereof. A conventional testbench may be executed via, for example, "xrun -f xrunArgs" that uses connect module(s) defined by connect rules "ie connrule=CR_full_fast". The present application augments the capabilities of conventional testbenches by the following modifications (denoted as "CM20") by adding xrunArgs_CM20 with modification of connect rules CR_full_fast into CR_full_fast_CM20 as shown in the following code/pseudocode. It shall be noted that "ie connrules=CR_full_fast_CM20" is a configuration line in one of the simulator's configuration files.

Xrun -f xrunArgs -f xrunArgs_CM20
ie connrules=CR_full_fast_CM20

More specifically, as described above, a set of functions (e.g., VPI functions, Tcl functions, etc.) 112B that provides access to values inside the simulator of a testbench top 102B while using this set of functions to, for example, read data, to write data, etc. with regard to one or more connect modules (e.g., 104B, 106B, 108B, 112B) In some embodiments, the connect module framework 114B ("CM20") in the architecture 100B may use an intermediate storage 116B to temporarily store data (e.g., values to change a setting of a connect module, etc.) In some embodiments, the connect module framework 114B may include the set of functions 112B and/or the intermediate storage 116B. A graphical illustration between the testbench and the storage is illustrated in, for example, FIG. 1B.

In some embodiments, the following entities may be created to support the expansion of the capabilities of a conventional simulation or verification tool, a testbench, etc. These entities may include, for example, "CM20.sv" that is a top module with, for example, user-defined routines over connect module data; "CM20_pkg.sv" that is a SystemVerilog package with access functions; "CM20.c" which represents a set of VPI (Verilog Procedural Interface) functions; "xrunArgs_CM20" that represent an arguments file for xrun (to augment existing xrunArgs which is a Verilog Run Argument file); and/or "connect_lib that represents a library of connect modules. In the aforementioned examples entities, a user may at most need to modify the "cM20.sv" top module that includes, for example, user-defined routines over connect module data while the other entities may be created once and reused in different runs of the same design or in different electronic designs.

An example test case is illustrated in the code/pseudocode below.

```
always @(hier.net.name.T_over_sample) begin
    if($realtime !=0) begin
        value2 hier.net.name.T_over sample/oversampling;
        $display("\f", value2);
        display_title("Adjust sampling time connect modules");
        foreach(all_cm[i]) begin
            name=all_cm[i];
            cm_update_real_sv(name, "m_Ts", value2);
        end
    end
end
always #20 us begin
    @(posedge hier.pll.output.net.name)
    oversampling=oversampling+1;
    value2=hier.net.name.T_over_sample/oversampling);
    $display("\f", oversampling);
    display_title("Adjust sampling time connect modules");
    foreach(all_cm[i]) begin
        name=all_cm[i];
        cm_update_real_sv(name, "m_Ts", value2);
    end
end
```

For the example test case, a design may declare real variables as shown in the figure below to utilize the techniques provided by the present application. It shall be noted that all variables are declared to have the values of "1" only for the ease of illustration, and that one or more variables may also be declared to other value(s).

```
string module_name;
real m_tr;
real m_tr;
real m_tf;
real m_vsup_min;
real m_vdelta;
real m_idelta;
real m_vtol;
real m_ttol;
real m_vddnet;
real m_vssnet;
real m_vsup;
real m_rin;
real m_itol;
real m_Vtol;
```

```
real m_Itol;
real m_rout;
parameter real cds_cust=1;
. . .
```

For the example test case, a design may define initial values and to enable dynamic control of connect module(s) as shown in the figure below to utilize the techniques provided by the present application as illustrated in the following code/pseudocode.

```
initial begin
    m_tr=1;
    m_tf=1;
    m_rout=1;
    m_vsup_min=1;
    m_vdelta=1;
    m_vtol=1;
    m_ttol=1;
    m_vddnet=1;
    m_vssnet=1;
    m_vsup=1;
    m_rin=1;
    m_itol=1;
    module_name=$sformatf ("% M");
    $register_name(module_name);
end
```

It shall be noted that "module_name=$sformatf ("% M");" and "$register_name(module_name);" may be included to provide dynamic and flexible control described herein, although it shall also be noted that other ways may also be implemented to provide dynamic and flexible control.

The aforementioned universal extension file (e.g., "CM20.h") may be included via "include "CM20.h" as shown in the code/pseudocode below.

```
parameter integer nox=0;
parameter integer enable_x=!nox;
/LOCAL VARIABLES
real Dreg; // register to write back logic
real Vstate, Rout; // output voltage & resistance states
real rout; // analog output resistance
real Xin; //flag if analog is in midrange
real txdig; // delay from midlevel to X in timescale units
real highzState; // 1 means high-Z and—means non-high-Z
//STRENGTH RELATED VARIABLES
reg sie;
integer zero_strength, one_strength;
integer d_strength;
integer isHiz;
reg [1:0] d_logic;
wire [7:0] Dval;
include "CM20.h"
    m_tr=1;
    m_tf=1;
    m_rout=1;
    m_vsup_min=1;
    m_vdelta=1;
    m_vtol=1;
    m_ttol=1;
    m_vddnet=1;
    m_vssnet=1;
    m_vsup=1;
    m_rin=1;
    m_itol=1;
```

An example header file (e.g., "CM20.h" referenced in the example shown immediately above) may include the following code/pseudocode:

```
////////////////////////CM2.0 header////////////////////////
string module_name;
    real m_tr;
    real m_tf;
    real m_Rout;
    real m_vsup_min;
    real m_vdelta;
    real m_idelta;
    real m_vtol;
    real m_ttol;
    real m_vddnet;
    real m_vssnet;
    real m_vsup;
    real m_rin;
    real m_itol;
    real m_Vtol;
    real m_Itol;
    real m_rout;
initial begin
    m_tr=1;
    m_tf=1;
    m_Rout=1;
    m_vsup_min=1;
    m_vdelta=1;
    m_vtol=1;
    m_ttol=1;
    m_vddnet=1;
    m_vssnet=1;
    m_vsup=1;
    m_idelta=1;
    m_rin=1;
    m_itol=1;
    m_Itol=1;
    m_Vtol=1;
    m_rout=1;
    module_name=$sformatf ("% M");
    $register_name(module_name);
    end
////////////////////////CM2.0
    header////////////////////////
```

In some embodiments, the aforementioned example header file may also include a macro definition section with some example code/pseudocode as shown below:

```
//Macro definition section
    'define cged_tolerance_check(A, B, CGED, VSTATE, VHI, VL0, TOL, NAME, MNAME)\
        parameter real NAME=0.0; \
        real MNAME=0.0; \
        always @(A, B) begin \
            if(CGED && $realtime >0) begin \
                #0; \
                if (((A==0) && (abs(VSTATE-VL0)>TOL))||
                    ((A==1) && (abs(VSTATE-VHI)>TOL )))
                    MNAME=1.0;
                else MNAME=0.0;
            end
        end
```

In some embodiments, the aforementioned header file may include a macro definition for an activity check of discrete input/output with the following example code/pseudocode:

```
'define activity_check(A, CGED, NAME, MNAME)
    parameter real NAME=0.0; \
    real MNAME=0.0; \
    always @(A) \
        if(CGED && $realtime >0) MNAME=MNAME+ 1.0;
```

In some embodiments, the aforementioned header file may include a macro definition for drivers count check of discrete input/output with the following example code/pseudocode:

```
'define drivers_count_check(A, NAME, MNAME)
    parameter real NAME=0.0;
    real MNAME=0.0;
    initial MNAME=$driver_count(A);
```

In some embodiments, the aforementioned header file may include a macro definition for ER consistency check for voltagemode with the following example code/pseudocode:

```
'define value_tolerance_check(A, B, CGED, VTOL, NAME, MNAME) \
    parameter real NAME=0.0; \
    real MNAME=0.0; \
    always @(A, B) begin \
        if(CGED && $realtime >0) begin \
            #0; \
            if(abs(A-B)>VTOL ) MNAME=1.0; \
            else MNAME=0.0; \
        end
    end
```

In some embodiments, the aforementioned header file may include a connect module type definition with the following example code/pseudocode:

```
'define cm_type(TYPE) \
    parameter string cm_type=TYPE;
'define cm_disable(VAL) \
    parameter real cm_disable=VAL; \
    real m_cm_disable=VAL; \
    real m_cm_enable=1.0-VAL; \
    always @(m_cm_disable) m_cm_enable=1.0-m_cm_disable;
```

In some embodiments, the aforementioned declaration and initialization of variables and provisioning of dynamic, flexible, and interactive controls may also be achieved with the example code/pseudocode below:

```
initial
    module_name=$sformatf ("% M);
    $register_name(module_name);
end
```

Each of various modules and engines described herein may be implemented as a pure software implementation, or a combination of hardware and software implementation. In some embodiments where a module is implemented at least partially as a software implementation, the module may be stored at least partially in memory (e.g., in random access memory, instruction cache, etc.) of at least one of these one or more computing systems 100 for execution.

System Architecture Overview

FIG. 6 illustrates a computerized system on which a method for implementing an electronic design using connect modules with dynamic and interactive control may be implemented. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

The illustrative computing system 600 may include an Internet-based computing platform providing a shared pool of configurable computer processing resources (e.g., computer networks, servers, storage, applications, services, etc.)

and data to other computers and devices in a ubiquitous, on-demand basis via the Internet in some embodiments. For example, the computing system 600 may include or may be a part of a cloud computing platform (e.g., a public cloud, a hybrid cloud, etc.) where computer system resources (e.g., storage resources, computing resource, etc.) are provided on an on-demand basis, without direct, active management by the users in some embodiments.

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, simulating, annotating, analyzing, optimizing, and/or identifying, etc. descried herein may be performed by one or more processors, one or more processor cores, or combination thereof.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

Various example embodiments of the invention are described herein. Reference is made to these examples in a non-limiting sense. The examples described herein are provided to illustrate more broadly applicable aspects of the invention. Various changes may be made to any of the examples or embodiments described herein, and equivalents thereof may be substituted without departing from the true spirit and scope of these examples or embodiments described herein.

In addition, many modifications may be made to adapt a particular situation, material, composition of matter, system, module, process, and/or process act(s) or step(s) to the objective(s), spirit or scope of the present disclosure. Further, as will be appreciated by those with skill in the art, each of the individual variations, examples, and/or embodiments, etc. described and illustrated herein has discrete components and features which may be readily separated from or combined with the feature or features of any of the other several variations, examples, and/or embodiments, etc., without departing from the scope or spirit of various variations, examples, and/or embodiments, etc. described herein. All such modifications are intended to be within the scope of claims associated with this disclosure. Moreover, various embodiments or portion(s) thereof described herein may be combined to provide further embodiments. Any aspects of the embodiments may be modified, if necessary, to employ concepts of the various variations, examples, and/or embodiments, etc. described herein to provide yet further embodiments.

I claim:

1. A computer implemented method for implementing an electronic design using connect modules with dynamic and interactive control, comprising:

identifying an electronic design having a signal propagating across a boundary between a digital domain and an analog domain;

initiating, at a processor of a computing system, an analysis of the electronic design to identify locations within the electronic design comprising boundaries between the digital domain and the analog domain;

determining a set of functions for accessing connect modules dynamically placed at the identified locations and identified in a connect module framework;

provisioning, at the connect module framework, the set of functions for reading from or writing to one or more internal characteristics of the identified connect modules dynamically placed in the electronic design; and accessing an internal characteristic of the one or more internal characteristics of the identified dynamically placed connect modules using the connect module framework.

2. The computer implemented method of claim 1, wherein accessing the internal characteristic of one or more of the dynamically placed connect modules comprises modifying a variable inside a connect module into a modified parameter or a modified variable with the connect module framework, wherein the analysis continues with the modified parameter or the modified variable without re-elaborating the electronic design or any portion thereof and without interrupting the analysis.

3. The computer implemented method of claim 1, wherein analysis of the electronic design is executable without re-elaborating the electronic design after an internal characteristic of one or more of the dynamically placed connect modules is modified.

4. The computer implemented method of claim 1, provisioning for the dynamically placed connect modules further comprising:
registering the set of functions; and
provisioning a bidirectional data flow between the electronic design and the internal characteristic of one or more of the dynamically placed connect modules using at least at least a first portion of the set of functions.

5. The computer implemented method of claim 4, provisioning for the one or more of the dynamically placed connect modules further comprising:
provisioning dynamic debugging or control for the one or more of the dynamically placed connect modules using at least a second portion of the set of functions; and
provisioning interactive manipulation of the one or more of the dynamically placed connect modules using at least a set of interpretative functions, wherein the set of interpretative functions comprises a Tcl function.

6. The computer implemented method of claim 5, provisioning for the one or more of the dynamically placed connect modules further comprising:
provisioning a dynamic flow for the electronic design using at least an extension file.

7. The computer implemented method of claim 1, the set of functions comprising:
a set of one or more basic access functions;
a set of one or more name parsing functions;
a set of one or more high-level access functions; or
a set of one or more flexible access functions.

8. The computer implemented method of claim 1, the set of functions:
identify, at the connect module framework, a set of the dynamically placed connect modules that matches a specific setting; or
adjust an internal parameter or a value thereof of a connect module during the analysis of the electronic design.

9. The computer implemented method of claim 1, the set of functions:
dynamically switch on or off the dynamically placed connect modules during the analysis of the electronic design; or
apply an assertion to the dynamically placed connect modules during the analysis of the electronic design.

10. The computer implemented method of claim 1, the set of functions:
identify one or more nets or one or more net segments along which a requisite number of dynamically placed connect modules are placed; or
identify one or more dynamically placed connect modules distributed at one or more specific hierarchical levels.

11. The computer implemented method of claim 1, the set of functions:
determining an updated value for the dynamically placed connect module during the analysis of the electronic design; or
storing the updated value for the dynamically placed connect module in a data structure.

12. The computer implemented method of claim 1, the set of functions:
upload a specific value to the dynamically placed connect module during the analysis of the dynamically placed connect module, wherein the analysis continues to execute with the specific value without re-elaboration of the electronic design; or
determine a set of dynamically placed connect modules in the electronic design using a filtering criteria during the analysis of the electronic design.

13. A non-transitory computer readable medium storing thereupon a sequence of instructions which, when executed by a processor, causes a set of acts for implementing an electronic design using connect modules with dynamic and interactive control, the set of acts comprising:
identifying an electronic design having a signal propagating across a boundary between a digital domain and an analog domain;
initiating, at the processor of a computing system, an analysis of the electronic design to identify locations within the electronic design comprising boundaries between the digital domain and the analog domain;
determining a set of functions for accessing connect modules dynamically placed at the identified locations and identified in a connect module framework;
provisioning, at the connect module framework, the set of functions for reading from or writing to one or more internal characteristics of the identified connect modules dynamically placed in the electronic design; and
accessing an internal characteristic of the one or more internal characteristics of the identified dynamically placed connect modules using the connect module framework.

14. The non-transitory computer readable medium of claim 13, wherein accessing the internal characteristic of one or more of the dynamically placed connect modules comprises modifying a variable inside a connect module with the connect module framework, wherein the analysis continues to execute without re- elaborating the electronic design or any portion thereof and without interrupting the analysis.

15. The non-transitory computer readable medium of claim 13, wherein the set of acts further comprise:
registering the set of functions; and
provisioning a bidirectional data flow between the electronic design and the internal characteristic of one or more of the dynamically placed connect modules using at least at least a first portion of the set of functions.

16. The non-transitory computer readable medium of claim 13, wherein the set of acts further comprise:
provisioning dynamic debugging or control for the one or more of the dynamically placed connect modules using at least a second portion of the set of functions;
provisioning interactive manipulation of the one or more of the dynamically placed connect modules using at least a set of interpretative functions, wherein the set of interpretative functions comprises a Tcl function; and provisioning a dynamic flow for the electronic design using at least an extension file.

17. A system for implementing an electronic design using connect modules with dynamic and interactive control, comprising:

a processor;

a memory having stored thereupon a sequence of instructions of program code, which when executed by the processor, causes a set of acts, the set of acts comprising:

identifying an electronic design having a signal propagating across a boundary between a digital domain and an analog domain;

initiating, at the processor of a computing system, an analysis of the electronic design to identify locations within the electronic design comprising boundaries between the digital domain and the analog domain;

determining a set of functions for accessing connect modules dynamically placed at the identified locations and identified in a connect module framework;

provisioning, at the connect module framework, the set of functions for reading from or writing to one or more internal characteristics of the identified connect modules dynamically placed in the electronic design; and accessing an internal characteristic of the one or more internal characteristics of the identified dynamically placed connect modules using the connect module framework.

18. The system of claim 17, wherein accessing the internal characteristic of one or more of the dynamically placed connect modules comprises modifying a variable inside a connect module with the connect module framework, wherein the analysis continues to execute without re-elaborating the electronic design or any portion thereof and without interrupting the analysis.

19. The system of claim 17, wherein the set of acts further comprise:

registering the set of functions; and provisioning a bidirectional data flow between the electronic design and the internal characteristic of one or more of the dynamically placed connect modules using at least at least a first portion of the set of functions.

20. The system of claim 17, wherein the set of acts further comprise:

provisioning dynamic debugging or control for the one or more of the dynamically placed connect modules using at least a second portion of the set of functions;

provisioning interactive manipulation of the one or more of the dynamically placed connect modules using at least a set of interpretative functions, wherein the set of interpretative functions comprises a Tcl function; and provisioning a dynamic flow for the electronic design using at least an extension file.

* * * * *